US011086444B2

(12) United States Patent
Yao et al.

(10) Patent No.: US 11,086,444 B2
(45) Date of Patent: Aug. 10, 2021

(54) INTEGRATED TOUCH AND DISPLAY ARCHITECTURES FOR SELF-CAPACITIVE TOUCH SENSORS

(71) Applicant: APPLE INC., Cupertino, CA (US)

(72) Inventors: Weijun Yao, San Jose, CA (US); Wei Hsin Yao, Palo Alto, CA (US); Yingxuan Li, Saratoga, CA (US); Bingrui Yang, Cupertino, CA (US); Marduke Yousefpor, San Jose, CA (US); Abbas Jamshidi-Roudbari, Sunnyvale, CA (US); Ahmad Al-Dahle, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/192,664

(22) Filed: Nov. 15, 2018

(65) Prior Publication Data

US 2019/0087051 A1    Mar. 21, 2019

Related U.S. Application Data

(63) Continuation of application No. 15/039,400, filed as application No. PCT/US2014/058367 on Sep. 30, 2014, now Pat. No. 10,209,813.

(Continued)

(51) Int. Cl.
*G06F 3/041* (2006.01)
*G06F 3/044* (2006.01)
*H01L 27/32* (2006.01)

(52) U.S. Cl.
CPC ........ *G06F 3/04164* (2019.05); *G06F 3/0446* (2019.05); *G06F 3/04166* (2019.05);
(Continued)

(58) Field of Classification Search
CPC .... G06F 3/0416; G06F 3/044; G06F 3/04166; H01L 27/323; H01L 27/3248; H01L 27/3265
See application file for complete search history.

(56) References Cited

U.S. PATENT DOCUMENTS

4,916,308 A    4/1990 Meadows
5,105,186 A    4/1992 May
(Continued)

FOREIGN PATENT DOCUMENTS

CN    1202254 A    12/1998
CN    1739083 A    2/2006
(Continued)

OTHER PUBLICATIONS

Chinese Search Report dated Mar. 23, 2011, for CN Application No. 2009201531939, with English Translation, 10 pages.
(Continued)

*Primary Examiner* — Vijay Shankar
*Assistant Examiner* — Cory A Almeida
(74) *Attorney, Agent, or Firm* — Kubota & Basol LLP

(57) ABSTRACT

A self-capacitive touch sensor panel configured to have a portion of both the touch and display functionality integrated into a common layer is provided. The touch sensor panel includes a layer with circuit elements that can switchably operate as both touch circuitry and display circuitry such that during a touch mode of the device the circuit elements operate as touch circuitry and during a display mode of the device the circuit elements operate as display circuitry. The touch mode and display mode can be time multiplexed. By integrating the touch hardware and display hardware into common layers, savings in power, weight and thickness of the device can be realized.

15 Claims, 15 Drawing Sheets

Related U.S. Application Data

(60) Provisional application No. 61/916,029, filed on Dec. 13, 2013.

(52) U.S. Cl.
CPC ........ *H01L 27/323* (2013.01); *H01L 27/3248* (2013.01); *H01L 27/3265* (2013.01)

(56) References Cited

U.S. PATENT DOCUMENTS

| | | | |
|---|---|---|---|
| 5,483,261 A | 1/1996 | Yasutake | |
| 5,488,204 A | 1/1996 | Mead et al. | |
| 5,589,856 A | 12/1996 | Stein et al. | |
| 5,606,346 A | 2/1997 | Kai et al. | |
| 5,825,352 A | 10/1998 | Bisset et al. | |
| 5,835,079 A | 11/1998 | Shieh | |
| 5,838,308 A | 11/1998 | Knapp et al. | |
| 5,841,427 A | 11/1998 | Teterwak | |
| 5,847,690 A | 12/1998 | Boie et al. | |
| 5,880,411 A | 3/1999 | Gillespie et al. | |
| 5,889,236 A | 3/1999 | Gillespie et al. | |
| 5,914,465 A | 6/1999 | Allen et al. | |
| 5,923,997 A | 7/1999 | Miyanaga et al. | |
| 6,025,647 A | 2/2000 | Shenoy et al. | |
| 6,057,903 A | 5/2000 | Colgan et al. | |
| 6,177,918 B1 | 1/2001 | Colgan et al. | |
| 6,188,391 B1 | 2/2001 | Seely et al. | |
| 6,204,897 B1 | 3/2001 | Colgan et al. | |
| 6,310,610 B1 | 10/2001 | Beaton et al. | |
| 6,323,846 B1 | 11/2001 | Westerman et al. | |
| 6,380,931 B1 | 4/2002 | Gillespie et al. | |
| 6,483,498 B1 | 11/2002 | Colgan et al. | |
| 6,501,529 B1 | 12/2002 | Kurihara et al. | |
| 6,586,101 B2 | 7/2003 | Chu | |
| 6,587,358 B1 | 7/2003 | Yasumura | |
| 6,680,448 B2 | 1/2004 | Kawashima et al. | |
| 6,690,387 B2 | 2/2004 | Zimmerman et al. | |
| 6,778,163 B2 | 8/2004 | Ozawa | |
| 6,844,673 B1 | 1/2005 | Bernkopf | |
| 6,847,354 B2 | 1/2005 | Vranish | |
| 6,914,640 B2 | 7/2005 | Yu | |
| 7,015,894 B2 | 3/2006 | Morohoshi | |
| 7,042,444 B2 | 5/2006 | Cok | |
| 7,133,032 B2 | 11/2006 | Cok | |
| 7,184,026 B2 | 2/2007 | Gordon et al. | |
| 7,184,064 B2 | 2/2007 | Zimmerman et al. | |
| 7,202,856 B2 | 4/2007 | Cok | |
| 7,230,608 B2 | 6/2007 | Cok | |
| 7,280,167 B2 | 10/2007 | Choi et al. | |
| 7,379,054 B2 | 5/2008 | Lee | |
| 7,482,187 B2 | 1/2009 | Shibusawa | |
| 7,605,864 B2 | 10/2009 | Takahashi et al. | |
| 7,663,607 B2 | 2/2010 | Hotelling et al. | |
| 7,701,539 B2 | 4/2010 | Shih et al. | |
| 7,705,834 B2 | 4/2010 | Swedin | |
| 7,859,521 B2 | 12/2010 | Hotelling et al. | |
| 7,880,703 B2 | 2/2011 | Park et al. | |
| 7,898,122 B2 | 3/2011 | Andrieux et al. | |
| 7,995,041 B2 | 8/2011 | Hotelling et al. | |
| 8,059,103 B2 | 11/2011 | Geaghan | |
| 8,149,002 B2 | 4/2012 | Ossart et al. | |
| 8,217,913 B2 | 7/2012 | Hotelling et al. | |
| 8,264,428 B2 | 9/2012 | Nam | |
| 8,300,021 B2 | 10/2012 | Ayres et al. | |
| 8,355,887 B1 | 1/2013 | Harding et al. | |
| 8,363,027 B2 | 1/2013 | Hotelling et al. | |
| 8,390,582 B2 | 3/2013 | Hotelling et al. | |
| 8,479,122 B2 | 7/2013 | Hotelling et al. | |
| 8,502,799 B2 | 8/2013 | Hotelling et al. | |
| 8,508,495 B2 | 8/2013 | Hotelling et al. | |
| 8,525,756 B2 | 9/2013 | Kwon | |
| 8,552,994 B2 | 10/2013 | Simmons | |
| 8,576,161 B2 | 11/2013 | Chang et al. | |
| 8,654,083 B2 | 2/2014 | Hotelling et al. | |
| 8,665,237 B2 | 3/2014 | Koshiyama et al. | |
| 8,743,087 B2 | 6/2014 | Hotelling et al. | |
| 8,760,412 B2 | 6/2014 | Hotelling et al. | |
| 8,766,950 B1 | 7/2014 | Morein et al. | |
| 8,773,351 B2 | 7/2014 | Rekimoto | |
| 8,773,397 B2 | 7/2014 | Hotelling et al. | |
| 8,890,850 B2 | 11/2014 | Chung et al. | |
| 8,917,256 B2 | 12/2014 | Roziere | |
| 8,922,521 B2 | 12/2014 | Hotelling et al. | |
| 9,000,782 B2 | 4/2015 | Roziere | |
| 9,024,913 B1 | 5/2015 | Jung et al. | |
| 9,075,490 B2 | 7/2015 | Hotelling et al. | |
| 9,117,679 B2 | 8/2015 | Ma | |
| 9,134,560 B2 | 9/2015 | Hotelling et al. | |
| 9,151,791 B2 | 10/2015 | Roziere | |
| 9,250,757 B2 | 2/2016 | Roziere | |
| 9,268,427 B2 | 2/2016 | Yousefpor et al. | |
| 9,336,723 B2 | 5/2016 | Gupta et al. | |
| 9,354,761 B2 | 5/2016 | Hotelling et al. | |
| 9,423,897 B2 | 8/2016 | Bae | |
| 9,442,330 B2 | 9/2016 | Huo | |
| 9,448,675 B2 | 9/2016 | Morein et al. | |
| 9,535,547 B2 | 1/2017 | Roziere | |
| 9,640,991 B2 | 5/2017 | Blondin et al. | |
| 9,690,397 B2 | 6/2017 | Shepelev et al. | |
| 9,760,200 B2 | 9/2017 | Hotelling et al. | |
| 9,857,925 B2 | 1/2018 | Morein et al. | |
| 9,996,175 B2 | 6/2018 | Hotelling et al. | |
| 10,007,388 B2 | 6/2018 | Roziere | |
| 10,019,103 B2 | 7/2018 | Gupta et al. | |
| 10,120,520 B2 | 11/2018 | Krah et al. | |
| 10,133,382 B2 | 11/2018 | Yang et al. | |
| 10,386,962 B1 | 8/2019 | Jin et al. | |
| 10,459,587 B2 | 10/2019 | Krah et al. | |
| 2001/0040665 A1 | 11/2001 | Ahn | |
| 2002/0015024 A1 | 2/2002 | Westerman et al. | |
| 2002/0084992 A1 | 7/2002 | Agnew | |
| 2003/0075427 A1 | 4/2003 | Caldwell | |
| 2003/0234769 A1 | 12/2003 | Cross et al. | |
| 2004/0140993 A1 | 7/2004 | Geaghan et al. | |
| 2004/0141096 A1 | 7/2004 | Mai | |
| 2004/0189587 A1 | 9/2004 | Jung et al. | |
| 2004/0239650 A1 | 12/2004 | Mackey | |
| 2004/0241920 A1 | 12/2004 | Hsiao et al. | |
| 2004/0243747 A1 | 12/2004 | Rekimoto | |
| 2005/0052582 A1 | 3/2005 | Mai | |
| 2005/0179668 A1 | 8/2005 | Edwards | |
| 2005/0219228 A1 | 10/2005 | Alameh et al. | |
| 2005/0231487 A1 | 10/2005 | Ming | |
| 2005/0243023 A1 | 11/2005 | Reddy et al. | |
| 2006/0007165 A1 | 1/2006 | Yang et al. | |
| 2006/0026521 A1 | 2/2006 | Hotelling et al. | |
| 2006/0097991 A1 | 5/2006 | Hotelling et al. | |
| 2006/0097992 A1 | 5/2006 | Gitzinger et al. | |
| 2006/0109222 A1 | 5/2006 | Lee et al. | |
| 2006/0145365 A1 | 7/2006 | Halls et al. | |
| 2006/0146033 A1 | 7/2006 | Chen et al. | |
| 2006/0146034 A1 | 7/2006 | Chen et al. | |
| 2006/0161871 A1 | 7/2006 | Hotelling et al. | |
| 2006/0197753 A1 | 9/2006 | Hotelling | |
| 2006/0203403 A1 | 9/2006 | Schediwy et al. | |
| 2006/0220033 A1 | 10/2006 | Yamasaki | |
| 2006/0244736 A1 | 11/2006 | Tseng | |
| 2006/0248208 A1 | 11/2006 | Walbeck et al. | |
| 2006/0262100 A1 | 11/2006 | Van Berkel | |
| 2006/0284639 A1 | 12/2006 | Reynolds | |
| 2007/0018969 A1 | 1/2007 | Chen et al. | |
| 2007/0040814 A1 | 2/2007 | Lee et al. | |
| 2007/0075977 A1 | 4/2007 | Chen et al. | |
| 2007/0165009 A1 | 7/2007 | Sakurai et al. | |
| 2007/0176905 A1 | 8/2007 | Shih et al. | |
| 2007/0216657 A1 | 9/2007 | Konicek | |
| 2007/0222762 A1 | 9/2007 | Van Delden et al. | |
| 2007/0240914 A1 | 10/2007 | Lai et al. | |
| 2007/0252801 A1 | 11/2007 | Park et al. | |
| 2007/0262967 A1 | 11/2007 | Rho | |
| 2007/0279395 A1 | 12/2007 | Philipp et al. | |
| 2008/0007533 A1 | 1/2008 | Hotelling | |
| 2008/0012835 A1 | 1/2008 | Rimon et al. | |
| 2008/0018581 A1 | 1/2008 | Park et al. | |

(56) References Cited

U.S. PATENT DOCUMENTS

| | | |
|---|---|---|
| 2008/0042985 A1 | 2/2008 | Katsuhito et al. |
| 2008/0048994 A1 | 2/2008 | Lee et al. |
| 2008/0055221 A1 | 3/2008 | Yabuta et al. |
| 2008/0055268 A1 | 3/2008 | Yoo et al. |
| 2008/0061800 A1 | 3/2008 | Reynolds et al. |
| 2008/0062139 A1 | 3/2008 | Hotelling et al. |
| 2008/0062140 A1 | 3/2008 | Hotelling et al. |
| 2008/0062147 A1 | 3/2008 | Hotelling et al. |
| 2008/0062148 A1 | 3/2008 | Hotelling et al. |
| 2008/0067528 A1 | 3/2008 | Choi et al. |
| 2008/0074401 A1 | 3/2008 | Chung et al. |
| 2008/0100572 A1 | 5/2008 | Boillot |
| 2008/0122800 A1 | 5/2008 | Meng |
| 2008/0129898 A1 | 6/2008 | Moon |
| 2008/0136980 A1 | 6/2008 | Rho et al. |
| 2008/0142281 A1 | 6/2008 | Geaghan |
| 2008/0150901 A1 | 6/2008 | Lowles et al. |
| 2008/0158118 A1 | 7/2008 | Ono et al. |
| 2008/0174321 A1 | 7/2008 | Kang et al. |
| 2008/0180365 A1 | 7/2008 | Ozaki |
| 2008/0186288 A1 | 8/2008 | Chang |
| 2008/0195180 A1 | 8/2008 | Stevenson et al. |
| 2008/0218488 A1 | 9/2008 | Yang et al. |
| 2008/0224962 A1 | 9/2008 | Kasai et al. |
| 2008/0231292 A1 | 9/2008 | Ossart et al. |
| 2008/0246496 A1 | 10/2008 | Hristov et al. |
| 2008/0273000 A1 | 11/2008 | Park et al. |
| 2008/0278178 A1 | 11/2008 | Philipp |
| 2008/0278458 A1 | 11/2008 | Masuzawa et al. |
| 2008/0303964 A1 | 12/2008 | Lee et al. |
| 2008/0309627 A1 | 12/2008 | Hotelling et al. |
| 2008/0309631 A1 | 12/2008 | Westerman |
| 2009/0002331 A1 | 1/2009 | Kamiya et al. |
| 2009/0009485 A1 | 1/2009 | Bytheway |
| 2009/0009486 A1 | 1/2009 | Sato et al. |
| 2009/0091546 A1 | 4/2009 | Joo et al. |
| 2009/0096760 A1 | 4/2009 | Ma et al. |
| 2009/0109192 A1 | 4/2009 | Liu |
| 2009/0141046 A1 | 6/2009 | Rathnam et al. |
| 2009/0179868 A1 | 7/2009 | Ayres et al. |
| 2009/0194344 A1 | 8/2009 | Harley et al. |
| 2009/0212642 A1 | 8/2009 | Krah |
| 2009/0237369 A1 | 9/2009 | Hur et al. |
| 2009/0238012 A1 | 9/2009 | Tatapudi et al. |
| 2009/0309851 A1* | 12/2009 | Bernstein ............. G06F 3/0416 345/174 |
| 2009/0322730 A1 | 12/2009 | Yamamoto et al. |
| 2010/0001973 A1 | 1/2010 | Hotelling et al. |
| 2010/0004029 A1 | 1/2010 | Kim |
| 2010/0007616 A1 | 1/2010 | Jang |
| 2010/0013745 A1 | 1/2010 | Kim et al. |
| 2010/0013791 A1* | 1/2010 | Haga ............... G06F 3/0412 345/174 |
| 2010/0019779 A1 | 1/2010 | Kato et al. |
| 2010/0031174 A1 | 2/2010 | Kim |
| 2010/0045632 A1 | 2/2010 | Yilmaz et al. |
| 2010/0090964 A1 | 4/2010 | Soo et al. |
| 2010/0097346 A1 | 4/2010 | Sleeman |
| 2010/0123667 A1 | 5/2010 | Kim et al. |
| 2010/0139991 A1 | 6/2010 | Philipp et al. |
| 2010/0149127 A1 | 6/2010 | Fisher et al. |
| 2010/0182018 A1 | 7/2010 | Hazelden |
| 2010/0182278 A1 | 7/2010 | Li et al. |
| 2010/0194697 A1 | 8/2010 | Hotelling et al. |
| 2010/0194699 A1 | 8/2010 | Hotelling et al. |
| 2010/0194707 A1 | 8/2010 | Chang |
| 2010/0201635 A1 | 8/2010 | Klinghult et al. |
| 2010/0253638 A1 | 10/2010 | Yousefpor et al. |
| 2010/0259503 A1 | 10/2010 | Yanase et al. |
| 2010/0265187 A1 | 10/2010 | Chang et al. |
| 2010/0265188 A1 | 10/2010 | Chang et al. |
| 2010/0277418 A1 | 11/2010 | Huang |
| 2010/0321305 A1 | 12/2010 | Chang et al. |
| 2010/0328262 A1 | 12/2010 | Huang et al. |
| 2010/0328263 A1 | 12/2010 | Lin |
| 2011/0001491 A1 | 1/2011 | Huang et al. |
| 2011/0006999 A1 | 1/2011 | Chang et al. |
| 2011/0007021 A1 | 1/2011 | Bernstein et al. |
| 2011/0007030 A1 | 1/2011 | Mo et al. |
| 2011/0025623 A1 | 2/2011 | Lin |
| 2011/0025635 A1 | 2/2011 | Lee |
| 2011/0061949 A1 | 3/2011 | Krah et al. |
| 2011/0074705 A1 | 3/2011 | Yousefpor et al. |
| 2011/0080391 A1 | 4/2011 | Brown et al. |
| 2011/0157093 A1* | 6/2011 | Bita ............... G02B 6/0055 345/175 |
| 2011/0169783 A1 | 7/2011 | Wang et al. |
| 2011/0210941 A1 | 9/2011 | Reynolds et al. |
| 2011/0228187 A1 | 9/2011 | Wu et al. |
| 2011/0242027 A1 | 10/2011 | Chang |
| 2011/0254795 A1 | 10/2011 | Chen et al. |
| 2011/0298727 A1 | 12/2011 | Yousefpor et al. |
| 2012/0026132 A1 | 2/2012 | Hotelling et al. |
| 2012/0050216 A1 | 3/2012 | Kremin et al. |
| 2012/0050217 A1 | 3/2012 | Noguchi et al. |
| 2012/0075239 A1 | 3/2012 | Azumi et al. |
| 2012/0098776 A1 | 4/2012 | Chen et al. |
| 2012/0132006 A1 | 5/2012 | Roziere |
| 2012/0146726 A1 | 6/2012 | Huang et al. |
| 2012/0146920 A1 | 6/2012 | Lin et al. |
| 2012/0162121 A1 | 6/2012 | Chang et al. |
| 2012/0162133 A1 | 6/2012 | Chen et al. |
| 2012/0162134 A1 | 6/2012 | Chen et al. |
| 2012/0182251 A1 | 7/2012 | Krah |
| 2012/0187965 A1 | 7/2012 | Roziere |
| 2012/0188200 A1 | 7/2012 | Roziere |
| 2012/0188201 A1 | 7/2012 | Binstead |
| 2012/0242597 A1 | 9/2012 | Hwang et al. |
| 2012/0249401 A1* | 10/2012 | Omoto ............... G06F 3/0412 345/80 |
| 2012/0262406 A1 | 10/2012 | Hotelling et al. |
| 2012/0262410 A1 | 10/2012 | Lim |
| 2012/0274603 A1 | 11/2012 | Kim et al. |
| 2012/0287068 A1 | 11/2012 | Colgate |
| 2012/0313881 A1 | 12/2012 | Ge et al. |
| 2013/0016612 A1 | 1/2013 | Vasseur et al. |
| 2013/0076647 A1 | 3/2013 | Yousefpor et al. |
| 2013/0076648 A1 | 3/2013 | Krah et al. |
| 2013/0078945 A1 | 3/2013 | Lavi et al. |
| 2013/0106755 A1 | 5/2013 | Hotelling et al. |
| 2013/0141343 A1 | 6/2013 | Yu et al. |
| 2013/0170116 A1 | 7/2013 | In et al. |
| 2013/0176276 A1 | 7/2013 | Shepelev |
| 2013/0181943 A1 | 7/2013 | Bulea et al. |
| 2013/0194229 A1 | 8/2013 | Sabo et al. |
| 2013/0215075 A1 | 8/2013 | Lee et al. |
| 2013/0293499 A1* | 11/2013 | Chang ............... G06F 3/0445 345/173 |
| 2013/0293513 A1 | 11/2013 | Hotelling et al. |
| 2013/0300953 A1 | 11/2013 | Hotelling et al. |
| 2013/0308031 A1 | 11/2013 | Theuwissen |
| 2013/0314342 A1 | 11/2013 | Kim et al. |
| 2013/0320994 A1 | 12/2013 | Brittain et al. |
| 2013/0328759 A1 | 12/2013 | Al-Dahle et al. |
| 2013/0328800 A1 | 12/2013 | Pu et al. |
| 2013/0335342 A1 | 12/2013 | Kim et al. |
| 2014/0049507 A1 | 2/2014 | Shepelev et al. |
| 2014/0070823 A1 | 3/2014 | Roziere |
| 2014/0078096 A1 | 3/2014 | Tan et al. |
| 2014/0078097 A1 | 3/2014 | Shepelev et al. |
| 2014/0103712 A1 | 4/2014 | Blondin et al. |
| 2014/0111496 A1 | 4/2014 | Gomez et al. |
| 2014/0125357 A1 | 5/2014 | Blondin et al. |
| 2014/0125628 A1 | 5/2014 | Yoshida et al. |
| 2014/0132534 A1 | 5/2014 | Kim |
| 2014/0132560 A1 | 5/2014 | Huang et al. |
| 2014/0139484 A1 | 5/2014 | Hotelling et al. |
| 2014/0152615 A1 | 6/2014 | Chang et al. |
| 2014/0160058 A1 | 6/2014 | Chen et al. |
| 2014/0210779 A1 | 7/2014 | Katsuta et al. |
| 2014/0225838 A1 | 8/2014 | Gupta et al. |
| 2014/0232955 A1 | 8/2014 | Roudbari et al. |
| 2014/0247247 A1 | 9/2014 | Hotelling et al. |
| 2014/0267070 A1 | 9/2014 | Shahparnia et al. |

(56) References Cited

U.S. PATENT DOCUMENTS

| | | |
|---|---|---|
| 2014/0267165 A1 | 9/2014 | Roziere |
| 2014/0333582 A1 | 11/2014 | Huo |
| 2014/0347321 A1 | 11/2014 | Roziere |
| 2014/0362029 A1 | 12/2014 | Mo et al. |
| 2015/0002752 A1 | 1/2015 | Shepelev et al. |
| 2015/0009421 A1 | 1/2015 | Choi et al. |
| 2015/0035768 A1 | 2/2015 | Shahparnia et al. |
| 2015/0035787 A1 | 2/2015 | Shahparnia et al. |
| 2015/0035797 A1 | 2/2015 | Shahparnia |
| 2015/0042600 A1 | 2/2015 | Lukanc et al. |
| 2015/0084911 A1 | 3/2015 | Stronks et al. |
| 2015/0091587 A1 | 4/2015 | Shepelev et al. |
| 2015/0091849 A1 | 4/2015 | Ludden |
| 2015/0116263 A1 | 4/2015 | Kim |
| 2015/0194470 A1 | 7/2015 | Hwang |
| 2015/0248177 A1 | 9/2015 | Maharyta |
| 2015/0277648 A1 | 10/2015 | Small |
| 2015/0309623 A1 | 10/2015 | Hotelling et al. |
| 2015/0338937 A1 | 11/2015 | Shepelev et al. |
| 2015/0363032 A1 | 12/2015 | Hotelling et al. |
| 2016/0018867 A1 | 1/2016 | Nys et al. |
| 2016/0034102 A1 | 2/2016 | Roziere et al. |
| 2016/0048234 A1 | 2/2016 | Chandran et al. |
| 2016/0098114 A1 | 4/2016 | Pylvas |
| 2016/0117017 A1 | 4/2016 | Kremin et al. |
| 2016/0170533 A1 | 6/2016 | Roziere |
| 2016/0188040 A1 | 6/2016 | Shin et al. |
| 2016/0211808 A1 | 7/2016 | Lee et al. |
| 2016/0224177 A1 | 8/2016 | Krah |
| 2016/0246403 A1 | 8/2016 | Zhao et al. |
| 2016/0253034 A1 | 9/2016 | Gupta et al. |
| 2016/0320898 A1 | 11/2016 | Tang et al. |
| 2017/0090644 A1 | 3/2017 | Yao et al. |
| 2017/0108968 A1 | 4/2017 | Roziere |
| 2017/0139539 A1 | 5/2017 | Yao et al. |
| 2017/0168619 A1 | 6/2017 | Yang et al. |
| 2017/0220156 A1 | 8/2017 | Blondin |
| 2017/0229502 A1 | 8/2017 | Liu et al. |
| 2017/0262121 A1 | 9/2017 | Kurasawa et al. |
| 2017/0315646 A1 | 11/2017 | Roziere |
| 2017/0351378 A1 | 12/2017 | Wang et al. |
| 2018/0032176 A1 | 2/2018 | Krah et al. |
| 2018/0074633 A1 | 3/2018 | Kida et al. |
| 2018/0107309 A1 | 4/2018 | Endo et al. |
| 2018/0314385 A1 | 11/2018 | Gupta |
| 2019/0073061 A1 | 3/2019 | Krah et al. |
| 2020/0019265 A1 | 1/2020 | Krah et al. |

FOREIGN PATENT DOCUMENTS

| | | |
|---|---|---|
| CN | 1800923 A | 7/2006 |
| CN | 1875312 A | 12/2006 |
| CN | 1942853 A | 4/2007 |
| CN | 1959481 A | 5/2007 |
| CN | 101122838 A | 2/2008 |
| CN | 10-1140366 A | 3/2008 |
| CN | 10-1140368 A | 3/2008 |
| CN | 10-1354625 A | 1/2009 |
| CN | 101349957 A | 1/2009 |
| CN | 2012-18943 Y | 4/2009 |
| CN | 101859215 A | 10/2010 |
| CN | 10-2483659 A | 5/2012 |
| CN | 102483673 A | 5/2012 |
| CN | 10-2760405 A | 10/2012 |
| CN | 102804114 A | 11/2012 |
| CN | 10-2881839 A | 1/2013 |
| CN | 103135815 A | 6/2013 |
| CN | 103258492 A | 8/2013 |
| CN | 103577008 A | 2/2014 |
| CN | 103885627 A | 6/2014 |
| CN | 104020880 A | 9/2014 |
| CN | 104252266 A | 12/2014 |
| DE | 11-2012 004912 T5 | 8/2014 |
| EP | 1 192 585 B1 | 4/2002 |
| EP | 1278390 A1 | 1/2003 |
| EP | 1391807 A1 | 2/2004 |
| EP | 1 422 60 A1 | 5/2004 |
| EP | 1 455 264 A2 | 9/2004 |
| EP | 2 144 146 A1 | 1/2010 |
| EP | 2 148 264 A2 | 1/2010 |
| EP | 2 224 277 A1 | 9/2010 |
| EP | 2256606 A2 | 12/2010 |
| FR | 2 756 048 A1 | 5/1998 |
| FR | 2 896 595 A1 | 7/2007 |
| FR | 2949008 A1 | 2/2011 |
| FR | 3 004 551 A1 | 10/2014 |
| JP | 03-081735 A | 4/1991 |
| JP | 7-110742 A | 4/1995 |
| JP | 2000-163031 A | 6/2000 |
| JP | 2002-342033 A | 11/2002 |
| JP | 2004-526265 A | 8/2004 |
| JP | 2005-523496 A | 8/2005 |
| JP | 2006-064769 A | 3/2006 |
| JP | 2006-251927 A | 9/2006 |
| JP | 2006-344163 A | 12/2006 |
| JP | 2007-334347 A | 12/2007 |
| JP | 2008-070983 A | 3/2008 |
| JP | 2008-117371 A | 5/2008 |
| JP | 2008-281616 A | 11/2008 |
| JP | 2009-086240 A | 4/2009 |
| JP | 2009-157373 A | 7/2009 |
| JP | 2011-141464 A | 7/2011 |
| KR | 10-2004-0002983 A | 1/2004 |
| KR | 10-2006-0073590 A | 6/2006 |
| KR | 10-2007-0082757 A | 8/2007 |
| KR | 10-2007-0102414 A | 10/2007 |
| KR | 10-2008-0041278 A | 5/2008 |
| KR | 10-2008-0047332 A | 5/2008 |
| KR | 10-2008-0060127 A | 7/2008 |
| KR | 10-2010-0054899 A | 5/2010 |
| KR | 10-2011-0044670 A | 4/2011 |
| KR | 10-2013-0054463 A | 5/2013 |
| KR | 10-2014-0043395 A | 4/2014 |
| TW | 200411266 A | 7/2004 |
| TW | I234676 B | 6/2005 |
| TW | 2008-26032 A | 6/2008 |
| TW | I303050 B | 11/2008 |
| TW | 200846990 A | 12/2008 |
| TW | 201126236 A1 | 8/2011 |
| WO | WO-95/27334 A1 | 10/1995 |
| WO | 97/18508 A1 | 5/1997 |
| WO | WO-2005/015373 A2 | 2/2005 |
| WO | WO-2005/015373 A3 | 2/2005 |
| WO | WO-2005/101178 A2 | 10/2005 |
| WO | WO-2005/101178 A3 | 10/2005 |
| WO | WO-2005/114369 A2 | 12/2005 |
| WO | WO-2005/114369 A3 | 12/2005 |
| WO | WO-2006/126703 A2 | 11/2006 |
| WO | WO-2007/003108 A1 | 1/2007 |
| WO | 2007/058727 A1 | 5/2007 |
| WO | WO-2007/146779 A2 | 12/2007 |
| WO | WO-2007/146779 A3 | 12/2007 |
| WO | WO-2007/146780 A2 | 12/2007 |
| WO | WO-2007/146780 A3 | 12/2007 |
| WO | WO-2007/146783 A2 | 12/2007 |
| WO | WO-2007/146783 A3 | 12/2007 |
| WO | WO-2008/000964 A1 | 1/2008 |
| WO | WO-2008/030780 A1 | 3/2008 |
| WO | WO-2010/002929 A2 | 1/2010 |
| WO | WO-2010/088666 A1 | 8/2010 |
| WO | WO-2010/088670 A1 | 8/2010 |
| WO | WO-2011/015795 A2 | 2/2011 |
| WO | WO-2011/015795 A3 | 2/2011 |
| WO | 2011/028451 A1 | 3/2011 |
| WO | WO-2013/093327 A1 | 6/2013 |
| WO | WO-2014/126661 A1 | 8/2014 |
| WO | 2015/017196 A1 | 2/2015 |
| WO | WO-2015/088629 A1 | 6/2015 |
| WO | WO-2015/175013 | 11/2015 |

(56) References Cited

FOREIGN PATENT DOCUMENTS

WO    WO-2015/175013 A1    11/2015
WO    WO-2016/066282 A1    5/2016

OTHER PUBLICATIONS

Chinese Search Report completed Dec. 16, 2011, for CN Application No. ZL2010201083672, filed Feb. 2, 2010, with English Translation, 15 pages.
Chinese Search Report completed Mar. 27, 2012, for CN Application No. ZL2010201083672, filed Feb. 2, 2010, with English Translation, 16 pages.
Chinese Search Report dated Oct. 27, 2015, for CN Application No. 201310128546.0, filed Feb. 2, 2010, with English Translation, four pages.
Chinese Search Report dated Mar. 30, 2016, for CN Application No. 201410145483.4, filed Jul. 3, 2009, with English Translation, four pages.
Chinese Search Report dated Jun. 21, 2018, for CN Application No. 201480065352.3, four pages.
European Search Report dated Jul. 6, 2010, for EP Application No. 10151966.8, seven pages.
European Search Report dated Dec. 9, 2010, for EP Application No. 09164196.9, filed Jun. 30, 2009, six pages.
European Search Report dated Oct. 4, 2011, for EP Application No. 09164196.9, filed Jun. 30, 2009, 11 pages.
European Search Report dated Oct. 6, 2017, for EP Application No. 14868756.9, eleven pages.
Final Office Action dated May 15, 2012, for U.S. Appl. No. 12/240,964, filed Sep. 29, 2008, 39 pages.
Final Office Action dated Nov. 13, 2014, for U.S. Appl. No. 14/275,527, filed May 12, 2014, ten pages.
International Search Report dated Mar. 17, 2010, for PCT Application No. PCT/US10/22883, filed Feb. 2, 2010, one page.
International Search Report dated Jun. 25, 2010, for PCT Application No. PCT/US10/22888, filed Feb. 2, 2010, two pages.
International Search Report dated Mar. 15, 2011, for PCT Application No. PCT/US2009/049313, filed Jun. 30, 2009, seven pages.
International Search Report dated Jun. 17, 2014 for PCT Application No. PCT/US2014/010901, five pages.
International Search Report dated Dec. 31, 2014, for PCT Application No. PCT/US14/58367, filed Sep. 30, 2014, two pages.
International Search Report dated Dec. 31, 2014, for PCT Application No. PCT/US14/58773, three pages.
Kanda, E. et al. (2008). "55.2: Integrated Active Matrix Capacitive Sensors for Touch Panel LTPS-TFT LCDs," *SID 08 Digest*, pp. 834-837.
Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Non-Final Office Action dated Sep. 15, 2011, for U.S. Appl. No. 12/545,649, filed Aug. 21, 2009, 1449 nine pages.
Non-Final Office Action dated Nov. 9, 2011, for U.S. Appl. No. 12/240,964, filed Sep. 29, 2008, 27 pages.
Non-Final Office Action dated Jul. 9, 2014, for U.S. Appl. No. 14/275,527, filed May 12, 2014, eight pages.
Non-Final Office Action dated Dec. 12, 2014, for U.S. Appl. No. 13/943,669, filed Jul. 16 2013, twelve pages.
Non-Final Office Action dated Feb. 3, 2015, for U.S. Appl. No. 14/275,527, filed May 12, 2014, 8 pages.
Non-Final Office Action dated Jul. 31, 2015 for U.S. Appl. No. 13/766,376, filed Feb. 13, 2013, 28 pages.
Non-Final Office Action dated Oct. 30, 2017, for U.S. Appl. No. 15/148,798, filed May 6, 2016, eleven pages.
Non-Final Office Action dated Nov. 24, 2017, for U.S. Appl. No. 15/039,400, filed May 25, 2016, sixteen pages.
Non-Final Office Action dated Dec. 15, 2017, for U.S. Appl. No. 15/311,836, filed Nov. 16, 2016, 14 pages.

Notice of Allowability dated Nov. 14, 2018, for U.S. Appl. No. 15/039,400, filed May 25, 2016, two pages.
Notice of Allowance dated Jun. 10, 2010, for U.S. Appl. No. 12/756,834, filed Apr. 8, 2010, six pages.
Notice of Allowance dated Jul. 7, 2010, for U.S. Appl. No. 12/558,488, filed Sep. 11, 2009, six pages.
Notice of Allowance dated Mar. 12, 2012, for U.S. Appl. No. 12/545,649, filed Aug. 21, 2009, seven pages.
Notice of Allowance dated Nov. 6, 2012, for U.S. Appl. No. 13/527,470, filed Jun. 19, 2012, 11 pages.
Notice of Allowance dated Apr. 17, 2013, for U.S. Appl. No. 12/240,964, filed Sep. 29, 2008, 13 pages.
Notice of Allowance dated Apr. 17, 2013 for U.S. Appl. No. 13/717,593, filed Dec. 17, 2012, 9 pages.
Notice of Allowance dated Nov. 13, 2013, for U.S. Appl. No. 13/936,980, filed Jul. 8, 2013, 20 pages.
Notice of Allowance dated Apr. 1, 2014, for U.S. Appl. No. 14/155,063, filed Jan. 14, 2014, 12 pages.
Notice of Allowance dated May 7, 2015, for U.S. Appl. No. 13/943,669, filed Jul. 16 2013, five pages.
Notice of Allowance dated May 12, 2015, for U.S. Appl. No. 14/275,527, filed May 12, 2014, seven pages.
Notice of Allowance dated Jan. 11, 2016 for U.S. Appl. No. 13/766,376, filed Feb. 13, 2013, ten pages.
Notice of Allowance dated Jan. 22, 2016, for U.S. Appl. No. 14/738,648, filed Jun. 12, 2015, nine pages.
Notice of Allowance dated May 2, 2017, for U.S. Appl. No. 14/835,515, filed Aug. 25, 2015, twelve pages.
Notice of Allowance dated Mar. 14, 2018, for U.S. Appl. No. 15/148,798, filed May 6, 2016, ten pages.
Notice of Allowance dated Jul. 5, 2018, for U.S. Appl. No. 15/311,836, filed Nov. 16, 2016, eight pages.
Notice of Allowance dated Oct. 18, 2018, for U.S. Appl. No. 15/039,400, filed May 25, 2016, eight pages.
Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.
Rubine, D.H. (May 1992). "Combing Gestures and Direct Mapulation," CHI '92, pp. 659-660.
Supplemental Notice of Allowability dated May 19, 2011, for U.S. Appl. No. 12/558,488, filed Sep. 11, 2009, 10 pages. (includes Notice of Allowance dated May 6, 2011.).
Supplemental Notice of Allowance dated Jan. 30, 2014, for U.S. Appl. No. 13/936,980, filed Jul. 8, 2013, 2 pages.
TW Search Report/Office Action dated Jan. 29, 2014, for TW Patent Application No. 099103062, with English Translation, two pages.
TW Search Report/Office Action dated Dec. 1, 2015, for TW Patent Application No. 103124315, with English Translation, three pages.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
Corrected Notice of Allowance received for U.S. Appl. No. 14/738,648, dated Apr. 25, 2016, 2 pages.
Corrected Notice of Allowance received for U.S. Appl. No. 14/738,648, dated Feb. 16, 2016, 4 pages.
Decision to Grant received for European Patent Application No. 10151966.8, dated Jan. 31, 2019, 2 pages.
Extended European Search Report received for European Patent Application No. 19151484.3, dated Sep. 23, 2019, 8 pages.
Notice of Allowance received for U.S. Appl. No. 12/756,834, dated Sep. 8, 2010, 7 pages.
Notice of Allowance received for U.S. Appl. No. 14/155,063, dated May 23, 2014, 2 pages.
Notice of Allowance received for U.S. Appl. No. 12/558,488, dated May 6, 2011, 8 pages.
Office Action received for Indian Patent Application No. 4883/KOLNP/2010, dated Mar. 6, 2020, 11 pages.
Restriction Requirement received for U.S. Appl. No. 12/240,964, dated Jun. 9, 2011, 6 pages.

(56) References Cited

OTHER PUBLICATIONS

Restriction Requirement received for U.S. Appl. No. 13/936,980, dated Sep. 17, 2013, 6 pages.
Supplemental Notice of Allowance received for U.S. Appl. No. 12/545,649, dated Apr. 3, 2012, 2 pages.
Supplemental Notice of Allowance received for U.S. Appl. No. 14/155,063, dated May 16, 2014, 2 pages.
Non-Final Office Action received for U.S. Appl. No. 15/313,549, dated Apr. 23, 2020, 33 pages.
Notice of Allowance received for U.S. Appl. No. 15/009,774, dated Jul. 1, 2020, 6 pages.
Notice of Allowance received for U.S. Appl. No. 16/581,721, dated Apr. 22, 2020, 5 pages.
Notice of Allowance received for U.S. Appl. No. 16/030,654, dated Jun. 16, 2020, 8 pages.
Search Report received for Chinese Patent Application No. 201680008313.9, dated Jul. 5, 2019, 4 pages (2 pages English Translation and 2 pages of Official copy).
Lowe, Doug, "Electronics Components: How to Use an Op Amp as a Voltage Comparator", Dummies, Available online at: <https://www.dummies.com/programming/electronics/components/electronics-components-how-to-use-an-pp-amp-as-a-voltage-comparator/>, 2012, 9 pages.
Decision of Rejection received for Chinese Patent Application No. 201480065352.3, dated Mar. 2, 2020, 14 pages (9 pages of English Translation and 5 pages of Official Copy).
Extended European Search Report received for European Patent Application No. 18197785.1, dated Apr. 5, 2019, 8 pages.
Final Office Action received for U.S. Appl. No. 15/009,774, dated Feb. 6, 2019, 16 pages.
Final Office Action received for U.S. Appl. No. 15/226,628, dated Mar. 28, 2018, 17 pages.
Final Office Action received for U.S. Appl. No. 15/313,549, dated Dec. 18, 2019, 24 pages.
Gibilisco, Stan, "The Illustrated Dictionary of Electronics", Eighth Edition, 2001, p. 173.
International Preliminary Report on Patentability received for PCT Patent Application No. PCT/US2017/044545, dated Feb. 7, 2019, 9 pages.
Non-Final Office Action received for U.S. Appl. No. 15/009,774, dated Jun. 20, 2018, 19 pages.
Non-Final Office Action received for U.S. Appl. No. 15/009,774, dated Sep. 4, 2019, 18 pages.
Non-Final Office Action received for U.S. Appl. No. 15/089,432, dated Jan. 24, 2018, 28 pages.
Non-Final Office Action received for U.S. Appl. No. 15/226,628, dated Aug. 11, 2017, 11 pages.
Non-Final Office Action received for U.S. Appl. No. 15/226,628, dated Aug. 27, 2018, 17 pages.
Non-Final Office Action received for U.S. Appl. No. 15/313,549, dated Dec. 21, 2018, 14 pages.
Non-Final Office Action received for U.S. Appl. No. 15/313,549, dated Jul. 10, 2019, 25 pages.
Non-Final Office Action received for U.S. Appl. No. 15/687,354, dated May 23, 2019, 18 pages.
Non-Final Office Action received for U.S. Appl. No. 16/030,654, dated Feb. 21, 2020, 15 pages.
Non-Final Office Action received for U.S. Appl. No. 16/179,565, dated Dec. 13, 2018, 9 pages.
Non-Final Office Action received for U.S. Appl. No. 16/581,721, dated Oct. 30, 2019, 10 pages.
Notice of Acceptance received for Australian Patent Application No. 2019200698, dated Feb. 12, 2020, 3 pages.
Notice of Allowance received for U.S. Appl. No. 15/009,774, dated Mar. 20, 2020, 16 pages.
Notice of Allowance received for U.S. Appl. No. 15/089,432, dated Jul. 30, 2018, 10 pages.
Notice of Allowance received for U.S. Appl. No. 15/226,628, dated Apr. 3, 2019, 6 pages.
Notice of Allowance received for U.S. Appl. No. 15/663,271, dated Jul. 5, 2018, 10 pages.
Notice of Allowance received for U.S. Appl. No. 15/687,354, dated Sep. 6, 2019, 12 pages.
Notice of Allowance received for U.S. Appl. No. 16/179,565, dated Jun. 6, 2019, 7 pages.
O'Connor, Todd, "mTouch Projected Capacitive Touch Screen Sensing Theory of Operation", Microchip TB3064, Microchip Technology Inc., 2010, pp. 1-16.
Office Action received for Australian Patent Application No. 2019200698, dated Nov. 23, 2019, 3 pages.
Office Action received for Chinese Patent Application No. 201680008313.9, dated Jul. 16, 2019, 20 pages (12 pages of English Translation and 8 pages of Official copy).
Restriction Requirement received for U.S. Appl. No. 13/766,376, dated Mar. 16, 2015, 6 pages.
Restriction Requirement received for U.S. Appl. No. 15/089,432, dated Jul. 17, 2017, 5 pages.
Notice of Allowance received for U.S. Appl. No. 15/313,549, dated Oct. 21, 2020, 10 pages.
Notice of Allowance received for U.S. Appl. No. 16/581,721, dated Aug. 4, 2020, 5 pages.
Extended European Search Report received for European Patent Application No. 20206655.1, dated Feb. 19, 2021, 7 pages.

* cited by examiner

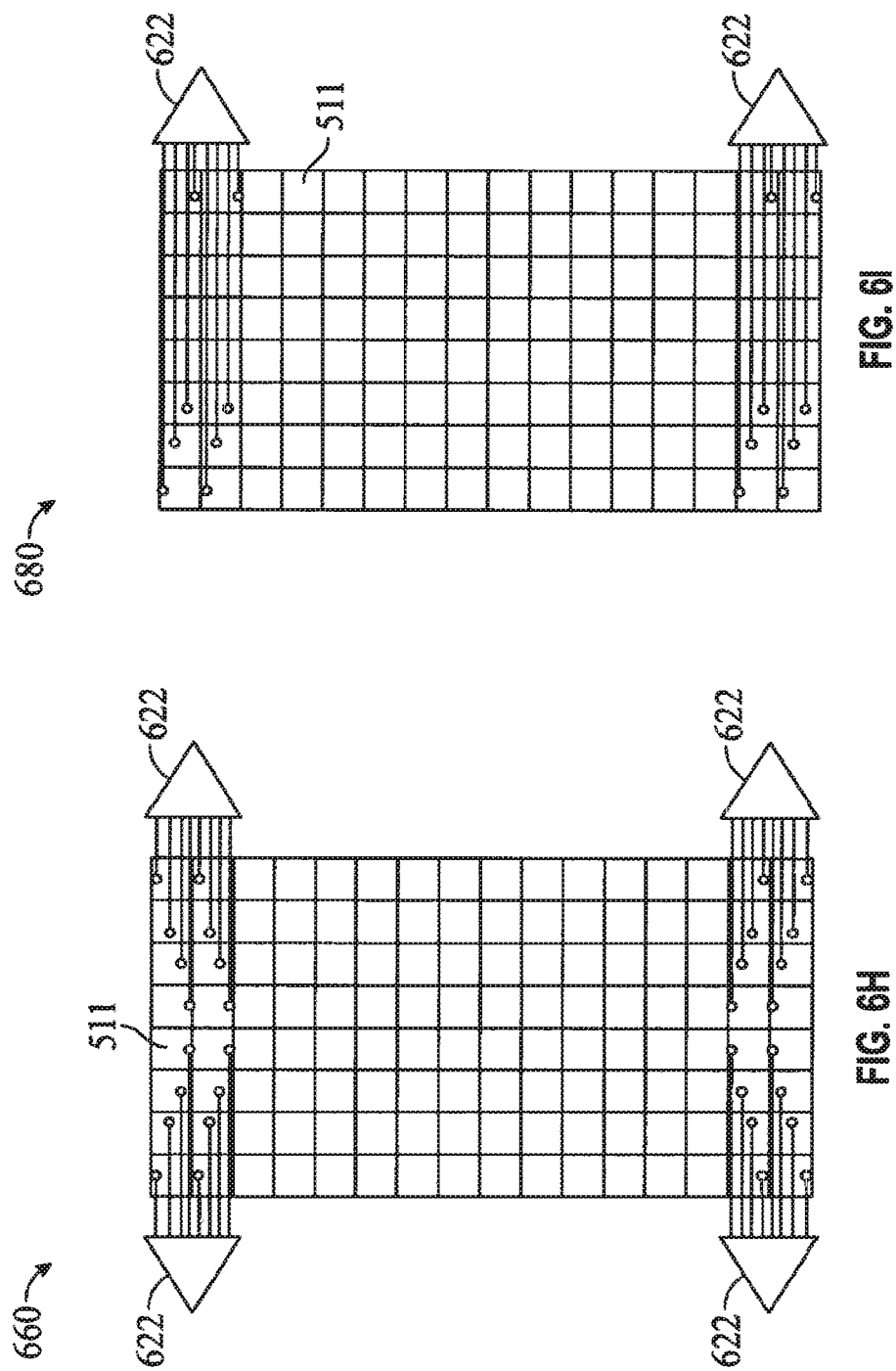

INTEGRATED TOUCH AND DISPLAY ARCHITECTURES FOR SELF-CAPACITIVE TOUCH SENSORS

CROSS-REFERENCE TO RELATED APPLICATIONS

This application is continuation of U.S. application Ser. No. 15/039,400, filed May 25, 2016, which is a National Phase application under 35 U.S.C. § 371 of International Application No. PCT/US2014/058367, filed Sep. 30, 2014, which claims the priority benefit of U.S. Application No. 61/916,029, filed Dec. 13, 2013, the contents of which are hereby incorporated by reference in their entireties for all intended purposes.

FIELD OF THE DISCLOSURE

This relates generally to touch sensor panels that are integrated with displays, and more particularly, to integrated touch sensors/displays in which a self-capacitance touch sensor is utilized to detect the presence of an object in contact with or in close proximity to a touch sensor panel.

BACKGROUND

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface.

Capacitive touch sensor panels can be formed from a matrix of substantially transparent conductive plates made from materials such as indium Tin Oxide (ITO). It is due in part to their substantial transparency that capacitive touch sensor panels can be overlaid on a display to form a touch screen, as described above. Some touch screens can be formed by, partially integrating touch sensing circuitry into a display pixel stackup (i.e., the stacked material layers forming the display pixels).

SUMMARY

The following description includes examples of integrated touch screens including touch pixels formed of circuit elements of a liquid crystal display (LCD) or organic light emitting diode (OILED), In an LCD display, the common electrodes (Vcom) in the TFT layer can be utilized during a touch sensing operation to form touch pixels.

BRIEF DESCRIPTION OF THE DRAWINGS

FIGS. 6F-6I illustrate additional wire routing schemes for an integrated touch and display layer according to examples of the disclosure.

DETAILED DESCRIPTION

In the following description of examples, reference is made to the accompanying drawings which form a part hereof, and in which it is shown by way of illustration specific examples in which examples of the disclosure can be practiced. It is to be understood that other examples can be used and structural changes can be made without departing from the scope of the examples of this disclosure.

The following description includes examples of integrated touch screens including touch pixels formed of circuit elements of a liquid crystal display (LCD) or organic light emitting diode (OLED), In an LCD display, the common electrodes (Vcom) in the TFT layer can be utilized during a touch sensing operation to form touch pixels.

During a display operation, in which an image is displayed on the touch screen, the Vcom can serve as part of the display circuitry, for example, by carrying a common voltage to create, in conjunction with a pixel voltage on a pixel electrode, an electric field across the liquid crystal. During a touch sensing operation, a group of Vcom electrodes can be used to form touch pixel electrodes that are coupled to sense circuitry to form touch sensors.

Figure 1C:
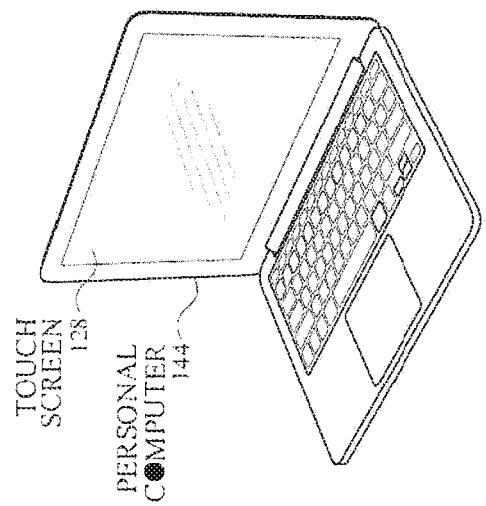
FIGS. 1A-1C illustrate an example mobile telephone, an example media player, and an example portable computing device that can each include an example touch screen according to examples of the disclosure.
Figure 1B:
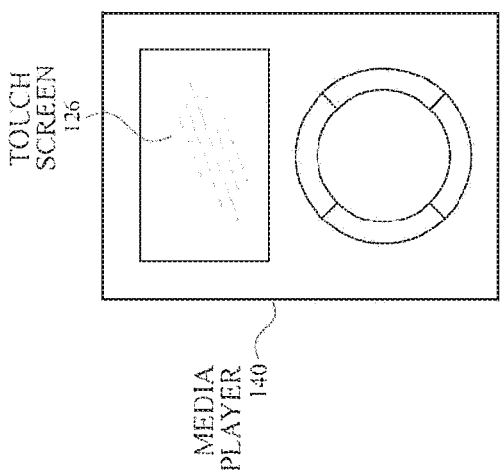
Figure 1A:
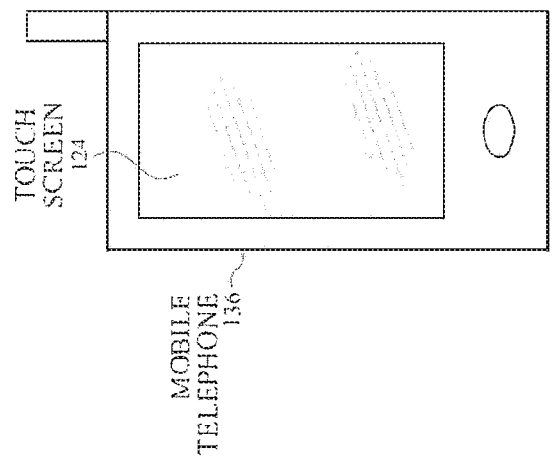

FIGS. 1A-1C show example systems in which a touch screen according to examples of the disclosure may be implemented. FIG. 1A illustrates an example mobile telephone 136 that includes a touch screen 124. FIG. 1B illustrates an example digital media player 140 that includes a touch screen 126. FIG. 1C illustrates an example portable computing device 144 that includes a touch screen 128. Touch screens 124, 126, and 128 can be based on self-capacitance. A self-capacitance based touch system can include a matrix of small, individual plates of conductive material that can be referred to as touch pixel electrodes (as described below with reference to touch screen 220 in FIG. 2). For example, a touch screen can include a plurality of individual touch pixel electrodes, each touch pixel electrode identifying or representing a unique location on the touch screen at which touch or proximity (i.e., a touch or proximity event) is to be sensed, and each touch pixel electrode being electrically isolated from the other touch pixel electrodes in the touch screen/panel. Such a touch screen can be referred to as a pixelated self-capacitance touch screen. During operation, a touch pixel electrode can be stimulated with an AC waveform, and the self-capacitance to ground of the touch pixel electrode can be measured. As an object approaches the touch pixel electrode, the self-capacitance to ground of the touch pixel electrode can change. This change in the self-capacitance of the touch pixel electrode can be detected and measured by the touch sensing system to determine the positions of multiple objects when they touch, or come in proximity to, the touch screen. In some examples, the electrodes of a self-capacitance based touch system can be formed from rows and columns of conductive material, and changes in the self-capacitance to ground of the rows and columns can be detected, similar to above. In some examples, a touch screen can be multi-touch, single touch, projection scan, full-imaging multi-touch, capacitive touch, etc.

In contrast to self-capacitance based touch systems, a mutual capacitance based touch system can include, for example, drive regions and sense regions, such as drive lines and sense lines. For example, drive lines can be formed in rows while sense lines can be formed in columns (e.g., orthogonal). Mutual capacitance touch pixels can be formed at the intersections of the rows and columns. During operation, the rows can be stimulated with an AC waveform and a mutual capacitance can be formed between the row and the column of the mutual capacitance touch pixel. As an object approaches the mutual capacitance touch pixel, some of the charge being coupled between the row and column of the mutual capacitance touch pixel can instead be coupled onto the object. This reduction in charge coupling across the mutual capacitance touch pixel can result in a net decrease in the mutual capacitance between the row and the column and a reduction in the AC waveform being coupled across the mutual capacitance touch pixel. This reduction in the charge-coupled AC waveform can be detected and measured by the touch sensing system to determine the positions of multiple objects when they touch the touch screen. Thus, a mutual capacitance based touch system can operate differently than a self-capacitance based touch system, the operation of which was described above.

Figure 2:
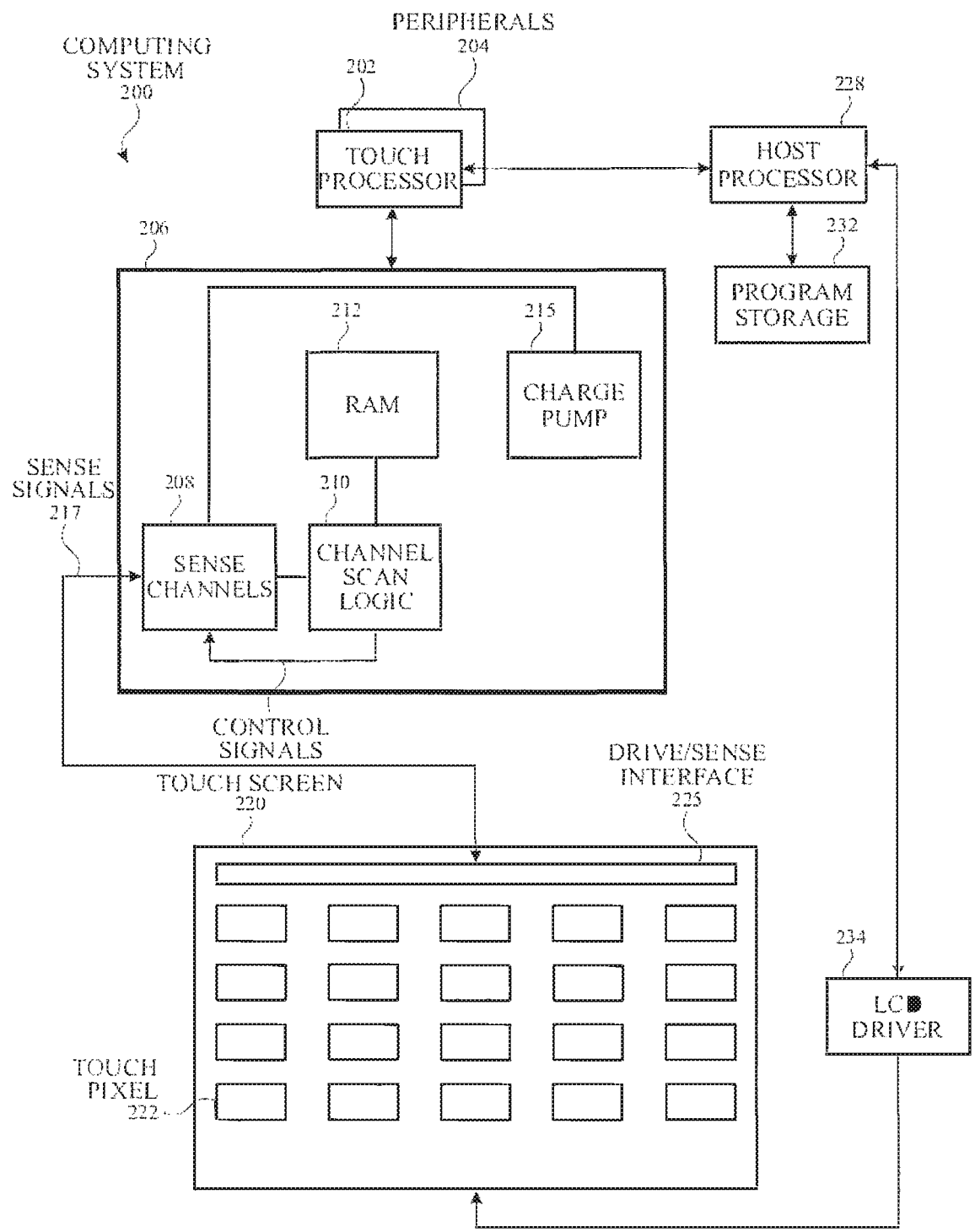
FIG. 2 is a block diagram of an example computing system that illustrates one implementation of an example touch screen according to examples of the disclosure.

FIG. 2 is a block diagram of an example computing system 200 that illustrates one implementation of an example touch screen 220 according to examples of the disclosure. Computing system 200 could be included in, for example, mobile telephone 136, digital media player 140, portable computing device 144, or any mobile or non-mobile computing device that includes a touch screen. Computing system 200 can include a touch sensing system including one or more touch processors 202, peripherals 204, a touch controller 206, and touch sensing circuitry (described in more detail below) Peripherals 204 can include, but are not limited to, random access memory (RAM) or other types of memory or storage, watchdog timers and the like. Touch controller 206 can include, but is not limited to, one or more sense channels 208, channel scan logic 210 and driver logic 214. Channel scan logic 210 can access RAM 212, autonomously read data from the sense channels and provide control for the sense channels. In addition, channel scan logic 210 can control driver logic 214 to generate stimulation signals 216 at various frequencies and phases that can be selectively applied to the touch pixel electrodes of touch screen 220, as described in more detail below. In some examples, touch controller 206, touch processor 202 and peripherals 204 can be integrated into a single application specific integrated circuit (ASIC).

Computing system 200 can also include a host processor 228 for receiving outputs from touch processor 202 and performing actions based on the outputs. For example, host processor 228 can be connected to program storage 232 and a display controller, such as an LCD driver 234. The LCD driver 234 can provide voltages on select (gate) lines to each pixel transistor and can provide data signals along data lines to these same transistors to control the pixel display image as described in more detail below. Host processor 228 can use LCD driver 234 to generate an image on touch screen 220, such as an image of a user interface (UI), and can use touch processor 202 and touch controller 206 to detect a touch on or near touch screen 220. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch processing.

Touch screen 220 can include touch sensing circuitry that can include a capacitive sensing medium having a plurality of electrically isolated touch pixel electrodes 222 (e.g., a pixelated self-capacitance touch screen). Touch pixel electrodes 222 can be driven by stimulation signals 216 from driver logic 214 through touch interfaces 224a and 224b, and resulting sense signals 217 generated from the touch pixel electrodes 222 can be transmitted through a sense interface 225 to sense channels 208 (also referred to as an event detection and demodulation circuit) in touch controller 206. The stimulation signal may be an alternating current (AC) waveform. Labeling the conductive plates used to detect touch (i.e., touch pixel electrodes 222) as "touch pixel" electrodes can be particularly useful when touch screen 220 is viewed as capturing an "image" of touch. In other words, after touch controller 206 has determined an amount of touch detected at each touch pixel electrode in the touch screen, the pattern of touch pixel electrodes in the touch screen at which a touch occurred can be thought of as an "image" of touch (e.g. a pattern of fingers touching the touch screen). It is understood that while driver logic 214 and sense channels 208 are illustrated as being separate blocks in touch controller 206, in a self-capacitance touch system, the sense channels alone can drive and sense touch pixel electrodes 222, as described in this disclosure. Further, in some examples, touch pixel electrodes 222 can be driven and sensed using the same line (e.g., sense signals 217).

Figure 3:
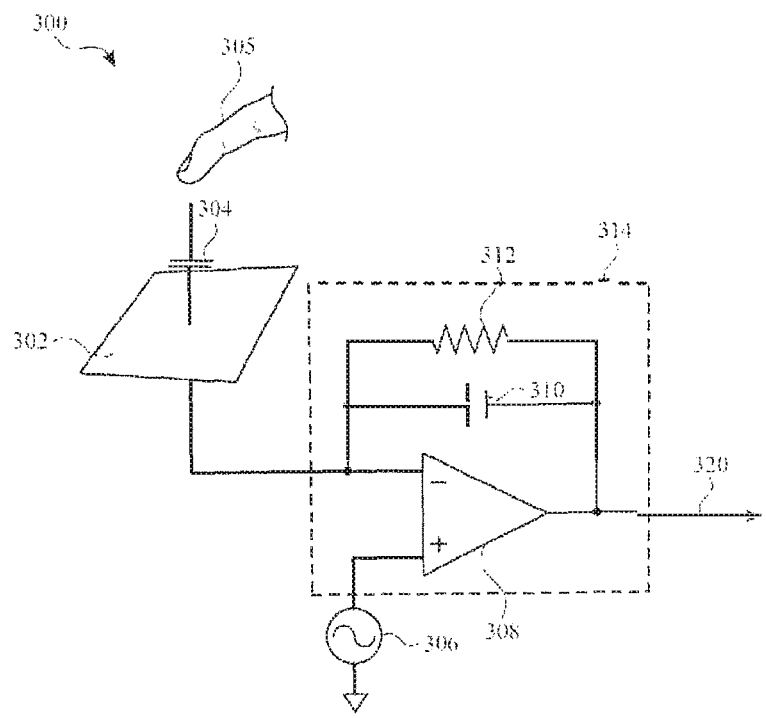
FIG. 3 illustrates an exemplary electrical circuit corresponding to a self-capacitance touch sensor electrode and sensing circuit according to examples of the disclosure.

FIG. 3 illustrates an exemplary electrical circuit corresponding to a self-capacitance touch sensor electrode (e.g., touch pixel electrode 222) and sensing circuit according to examples of the disclosure. Electrode 302 can have an inherent self-capacitance to ground associated with it, and also an additional self-capacitance to ground that is formed only when an object is in proximity to the electrode. Touch electrode 302 can be coupled to sensing circuit 314. Sensing circuit 314 can include an operational amplifier 308, feedback resistor 312, feedback capacitor 310 and an input voltage source 306, although other configurations can be employed. For example, feedback resistor 312 can be replaced by a switched capacitor resistor in order to minimize any parasitic capacitance effect caused by a variable feedback resistor. The touch electrode can be coupled to the inverting input of operational amplifier 308. An AC voltage source 306 (Vac) can be coupled to the non-inverting input of operational amplifier 308. The touch sensor circuit 300 can be configured to sense changes in the total self-capacitance of the electrode induced by a finger or object either touching or in proximity to the touch sensor panel or touch screen. The output 320 of the touch sense circuit 300 is used to determine the presence of a proximity event. The output 320 can either be used by a processor to determine the presence of a proximity or touch event, or output 320 can be inputted into a discrete logic network to determine the presence of a touch or proximity event.

Figure 4:
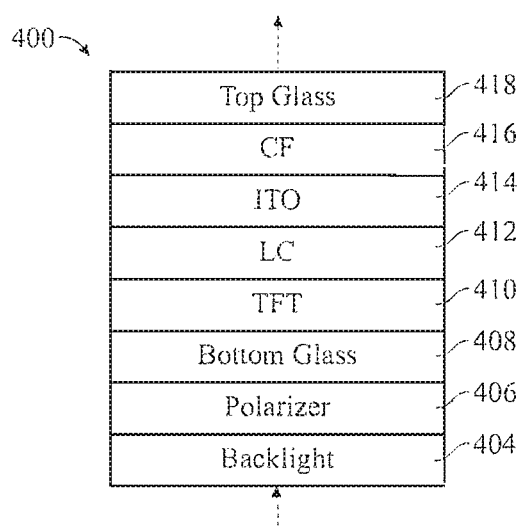
FIG. 4 illustrates exemplary layers of an LCD display screen stack-up according to some disclosed examples.

FIG. 4 illustrates exemplary layers of an LCD display screen stack-up according to some disclosed examples. Backlight 404 can provide white light that can be directed towards the aperture of the stack-up. As will be discussed below, the backlight can supply the rest of the display stack-up with light that can be oriented in particular orientation based on the needs of the rest of the stack-up. In order to control the brightness of the light, the white light produced by the backlight 404 can be fed into a polarizer 406 that can impart polarity to the light. The polarized light coming out of polarizer 406 can be fed through bottom cover 408 into a liquid crystal layer 412 that can be sandwiched between an Indium Tin Oxide (ITO) layer 415 and a Thin Film Transistor (TFT) layer 410. TFT substrate layer 410 can contain the electrical components necessary to create the electric field, in conjunction with ITO layer 414 that drives the liquid crystal layer 412. More specifically, TFT substrate 410 can include various different layers that can include display elements such as data lines, gate lines, TFTs, common and pixel electrodes, etc. These components can help create a controlled electric field that orients liquid crystals located in liquid crystal layer 412 into a particular orientation, based on the desired color to be displayed at any particular pixel. The orientation of a liquid crystal element in liquid crystal layer 412 can alter the orientation of the polarized light that is passed through it from backlight 404. The altered light from liquid crystal layer 412 can then be passed through color filter layer 416. Color filter layer 416 can contain a polarizer. The polarizer in color filter layer 416 can interact with the polarized light coming from liquid crystal layer 412, whose orientation can be altered depending on the electric field applied across the liquid crystal layer. The amount of light allowed to pass through color filter layer 416 into top cover 418 can be determined by the orientation of the light as determined by the orientation of the liquid crystal layer 412. While the top cover 418 is described as being glass, any type of transparent cover can be used including plastic for example. By polarizing the white light coming out of backlight 404, changing the orientation of the light in liquid crystal layer 412, and then passing the light through a polarizer in color filter layer 416, the brightness of light can be controlled on a per pixel basis. Color filter layer 416 also can contain a plurality of color filters that can change the light passed through it into red, green and blue. By controlling the brightness and color of light on a per pixel basis, a desired image can be rendered on the display.

Integrating a touch sensor described above in reference to FIG. 3, with a display stack-up described above in reference to FIG. 4 can provide many benefits. For instance, by integrating the touch sensor with the display, the total width of the device can be minimized since the touch and display occupy a common layer. In an architecture in which the display and the touch sensor are mutually exclusive, the total thickness of the device may be greater. Thus, by integrating the touch and display—in other words, to have the touch sensor occupy one of the layers in the display stack-up—the total weight and thickness of the device can be minimized. In order to integrate layers such that both the touch sensor panel and the display share a layer, the circuit elements of a particular layer may be used as both display hardware and touch hardware. The touch functionality and the display functionality of the device can be time multiplexed (as will be described below) such that during a touch mode, the circuit elements of the common layer can be used as touch circuitry and during a display mode the circuit elements of the common layer can be used as display circuitry. In some examples, one or more of touch controller 206, touch processor 202 and host processor 228 can control the time multiplexing of the touch and display functionalities of the device.

Figure 5:
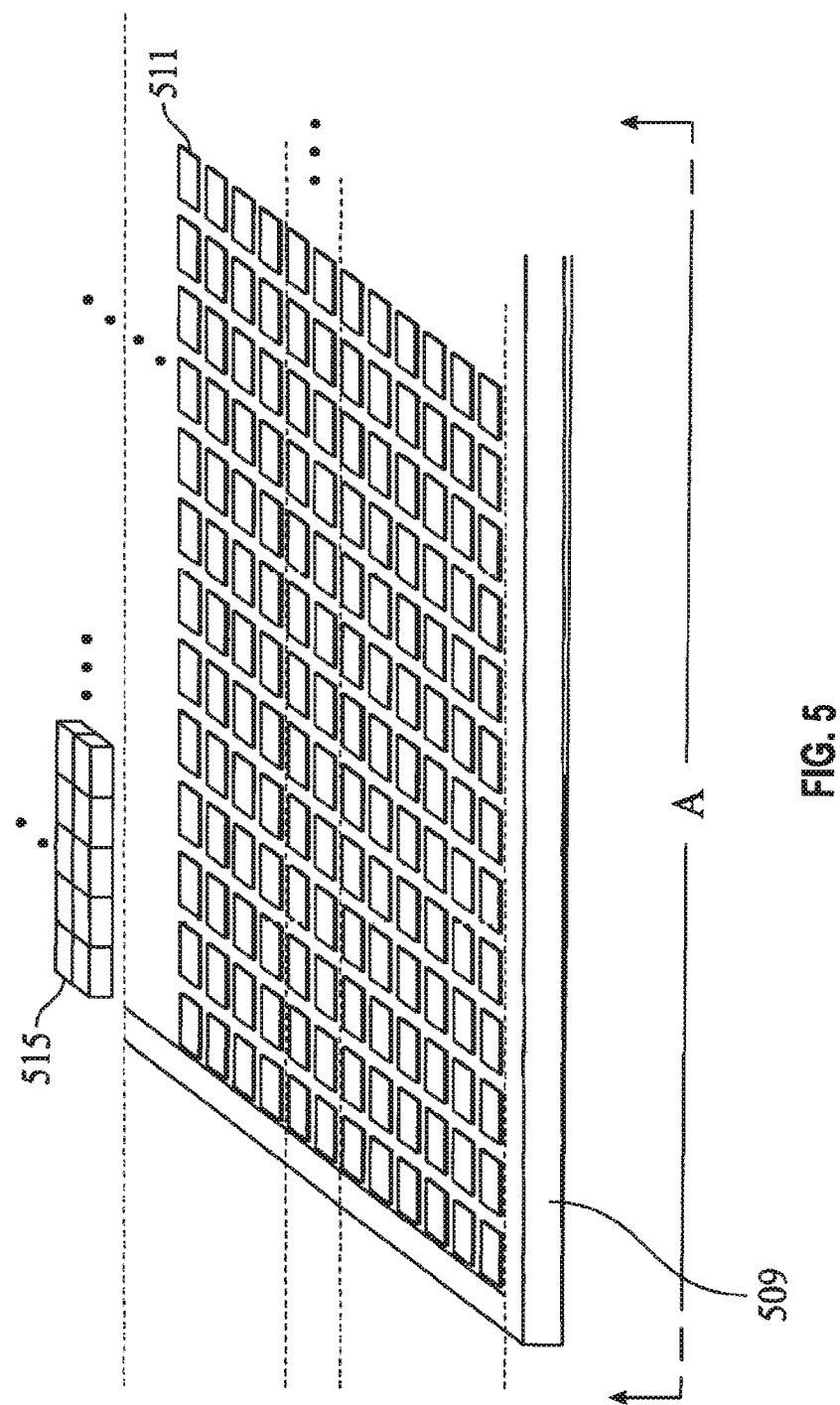
FIG. 5 illustrates an exemplary stack-up layer that can be used as both touch circuitry and display circuitry according to examples of the disclosure.

FIG. 5 illustrates an exemplary stack-up layer that can be used as both touch circuitry and display circuitry according to examples of the disclosure. In the example of FIG. 4, the TFT layer 410 can be modified such that circuit elements residing on the TFT layer can be used as display circuitry during a display mode of the device and as touch circuitry during a touch mode of the device. TFT layer 509 can have circuit elements 511 formed on it. Circuit elements 511 can constitute the $V_{com}$ layer of a display. Circuit elements 511 can be, for example, multi-function circuit elements that operate as part of the display circuitry of the touch screen and also as part of the touch sensing circuitry of the touch screen. In some examples, circuit elements 511 can be single-function circuit elements that operate only as part of the touch sensing system. In addition to circuit elements 511, other circuit elements (not shown) can be formed on TFT glass 509, such as transistors, capacitors, conductive vias, data lines, gate lines, etc. Circuit elements 511 and the other circuit elements formed on TFT glass 509 can operate together to perform various display functionality required for the type of display technology used by touch screen 220, as one skilled in the art would understand. The circuit elements can include, for example, elements that can exist in conventional LCD displays. It is noted that circuit elements are not limited to whole circuit components, such a whole capacitor, a whole transistor, etc., but can include portions of circuitry, such as only one of the two plates of a parallel plate capacitor.

During a touch mode of the device, some or all of the circuit elements 511 can be electrically connected to sense circuitry such that each circuit element can be used as a touch pixel electrode with the circuit configuration illustrated in FIG. 3, The circuit elements 511 can act as electrodes 302 in the circuit configuration of FIG. 3 during a touch detection mode of the device. During a display mode of the device, the circuit elements 511 can be configured such that they act as plate capacitors biased at a common voltage in an LCD display as in known in the art.

FIG. 5 also shows a pixel material 515 disposed between TFT glass 509 and a color filter glass (see FIG. 4). Pixel material 515 is shown in FIG. 6 as separate volume regions or cells above the circuit elements 511. For example, when the pixel material is a liquid crystal, these volume regions or cells are meant to illustrate regions of the liquid crystal controlled by the electric field produced by the pixel electrode and common electrode of the volume region or cell under consideration. Pixel material 515 can be a material that, when operated on by the display circuitry of touch screen 220, can generate or control an amount, color, etc., of light produced by each display pixel. For example, in an LCD touch screen, pixel material 515 can be formed of liquid crystal, with each display pixel controlling a volume region or cell of the liquid crystal. In this case, for example, various methods exist for operating liquid crystal in a display operation to control the amount of light emanating from each display pixel, e.g., applying an electric field in a particular direction depending on the type of LCD technology employed by the touch screen. In an in-plane switching (WS), fringe field switching (FFS), and advanced fringe field switching (AFFS) LCD displays, for example, electrical fields between pixel electrodes and common electrodes (Vcom) disposed on the same side of the liquid crystal can operate on the liquid crystal material to control the amount of light from a backlight that passes through the display pixel. One skilled in the art would understand that various pixel materials can be used, depending on the type of display technology of the touch screen.

Figure 6A:
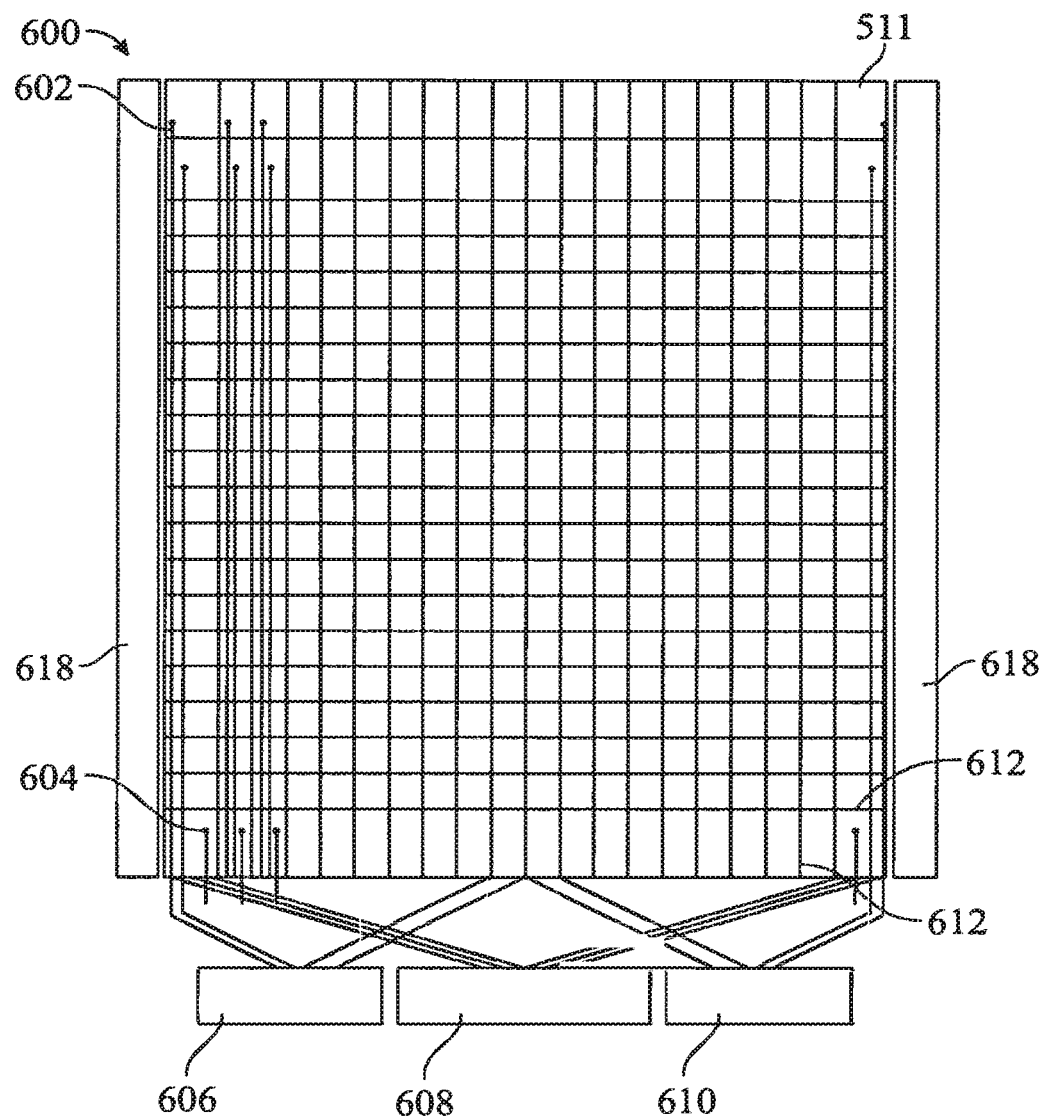
FIGS. 6A-6D illustrate exemplary wire routing schemes for an integrated touch and display layer according to examples of the disclosure.

Using circuit elements 511 as touch pixel electrodes can create wire routing issues, since each circuit element may need to be individually connected to a touch controller so that each touch pixel electrode is connected to a sense circuit that can detect changes in a self-capacitance of the pixel caused by a finger or object in contact with or in close proximity to the touch sensor panel. FIG. 6a illustrates a wire routing scheme for an integrated touch and display layer according to examples of the disclosure. As illustrated, a TFT layer 600 can be populated with circuit elements 511 that, in some examples, can act as both a touch pixel electrode in a touch mode and as a LCD display electrode in a display mode of the device. As described above, because each and every circuit element 511 may need to be individually connected to a sense circuit to detect changes in self-capacitance caused by a touch event (e.g., by using a touch signal line, such as lines 602 or 604, connected to touch chips 606 or 610), and because display pixels associated with the circuit elements may require separate wiring for display functionality (e.g., display data lines connecting TFT(s) in a display pixel to display controller chip 608), there can be many wires that need to be routed from each pixel to a touch chip or display controller. In some examples, touch signal lines, display data lines and circuit elements 511 can be routed and formed in different metal layers than each other. For example, circuit elements 511 can be formed in a first metal layer, display data lines can be routed in a second metal layer, and touch signal lines can be routed in a third metal layer in some examples, either the display data lines or the touch signal lines can be routed in the same layer in which circuit elements 511 are formed. The above routing schemes may need to be "invisible" to the user of the device. In other words, since parts of the display are visible to the user, the wire routing scheme may need to avoid occupying "active areas" of the display (i.e., areas that are visible to the user).

Figure 6B:
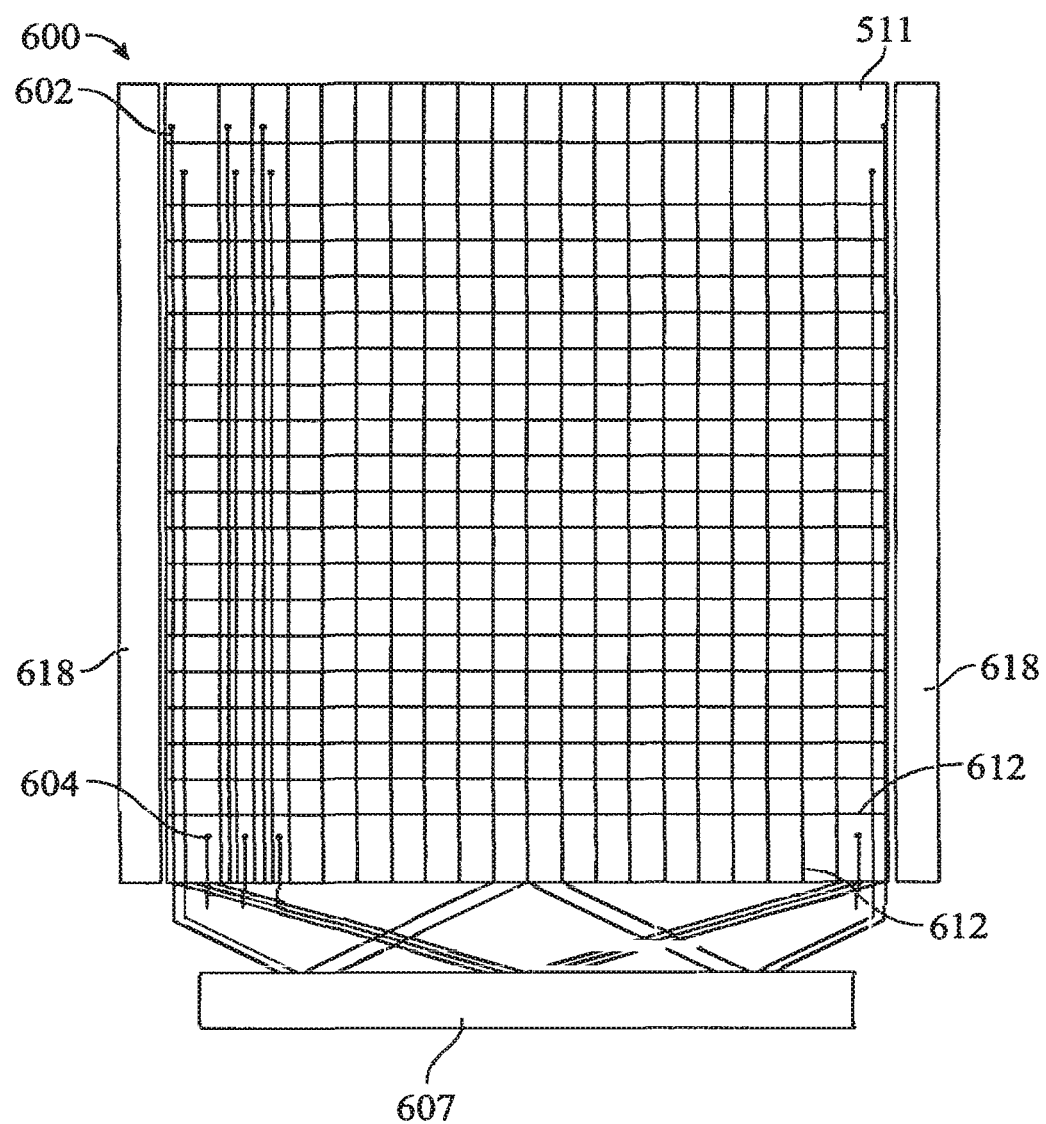
Figure 6C:
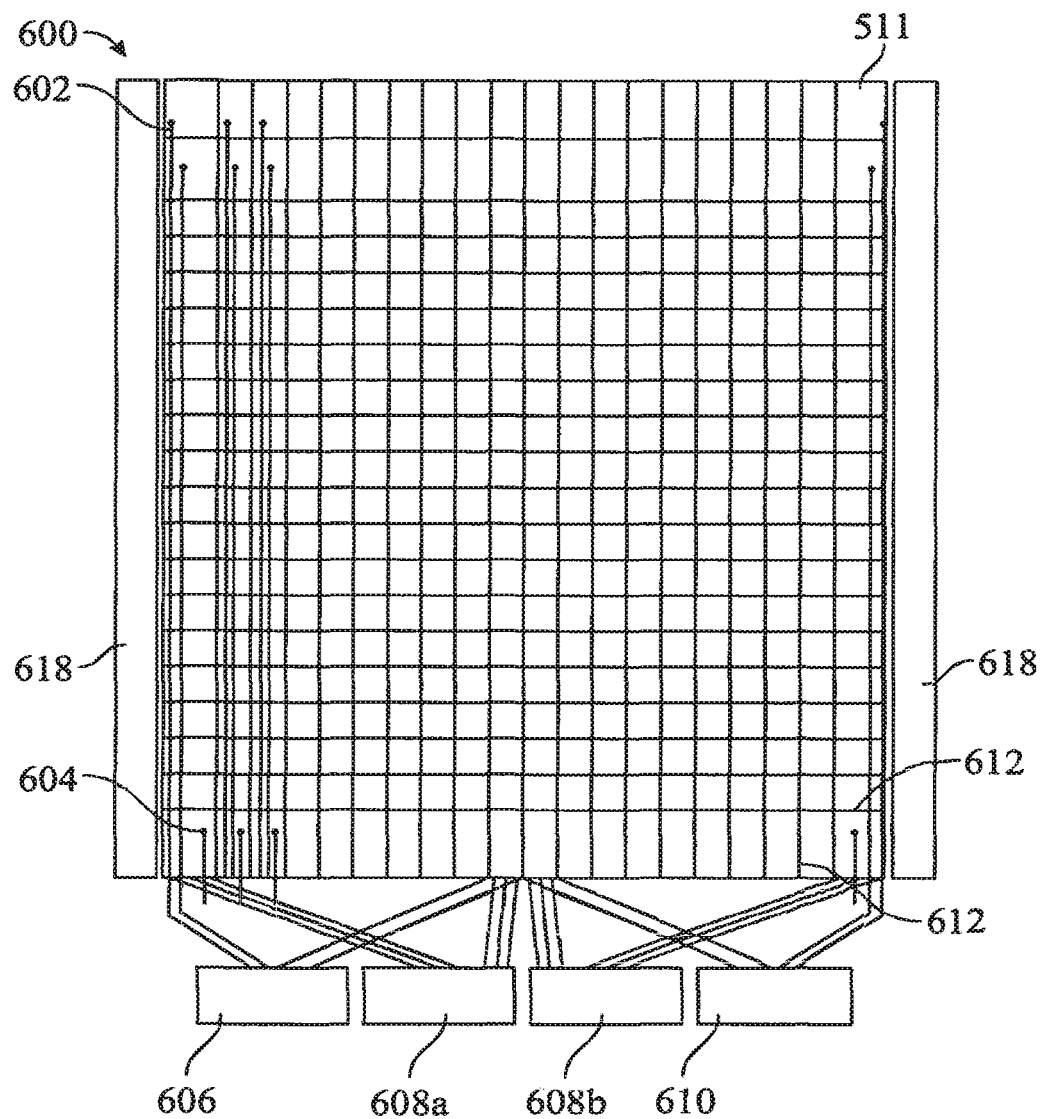
Figure 6D:
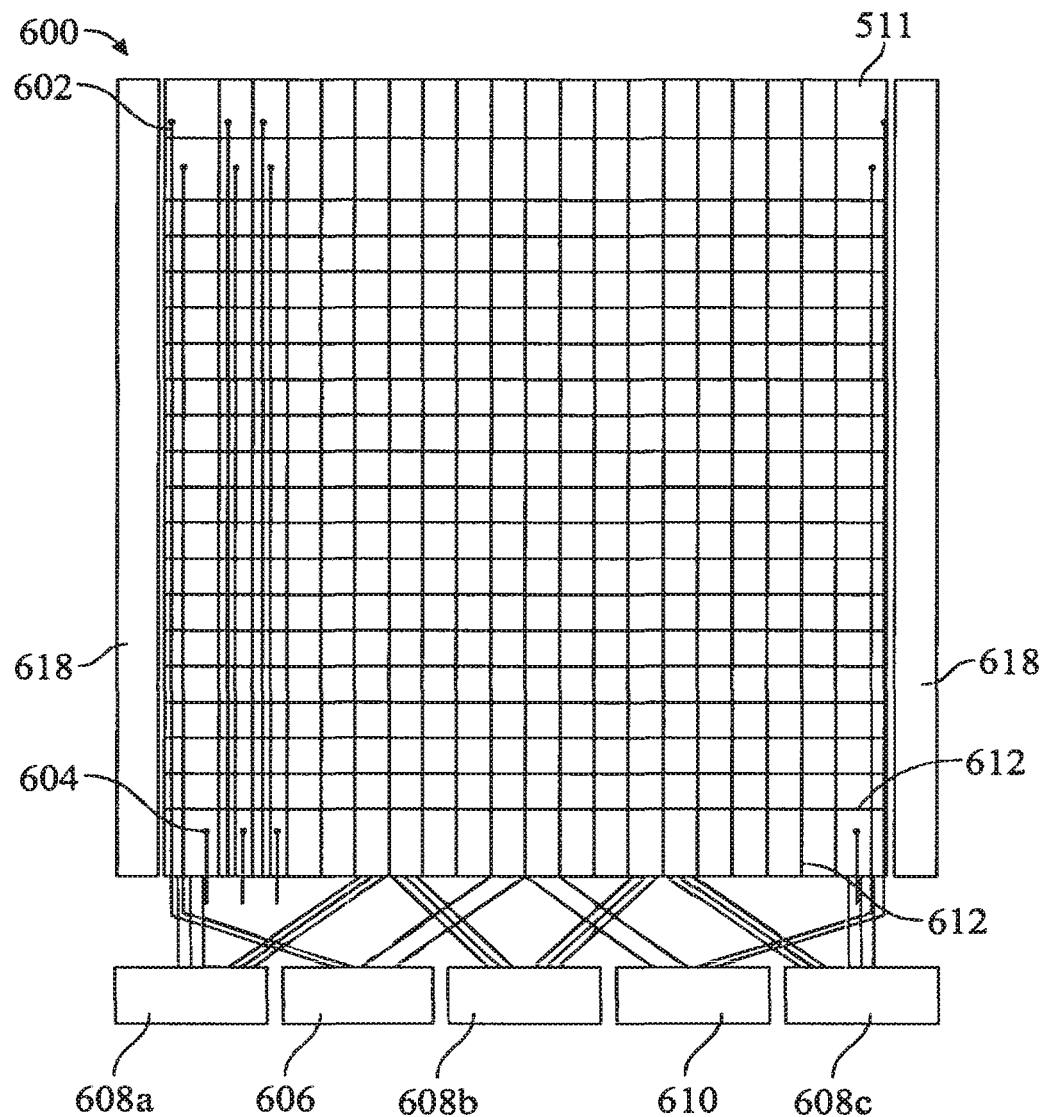
Figure 6E:
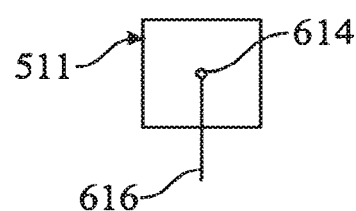
FIG. 6E illustrates an exemplary routing connecting for a single touch pixel according to examples of the disclosure.
Figure 6G:
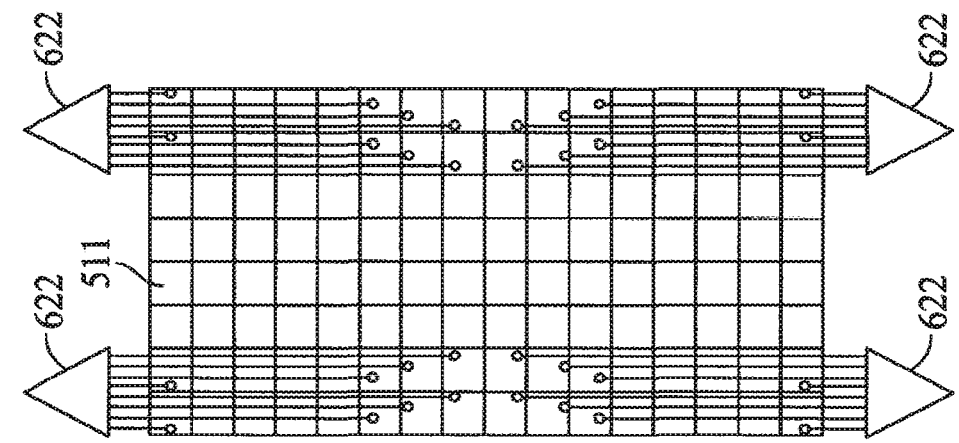
Figure 6F:
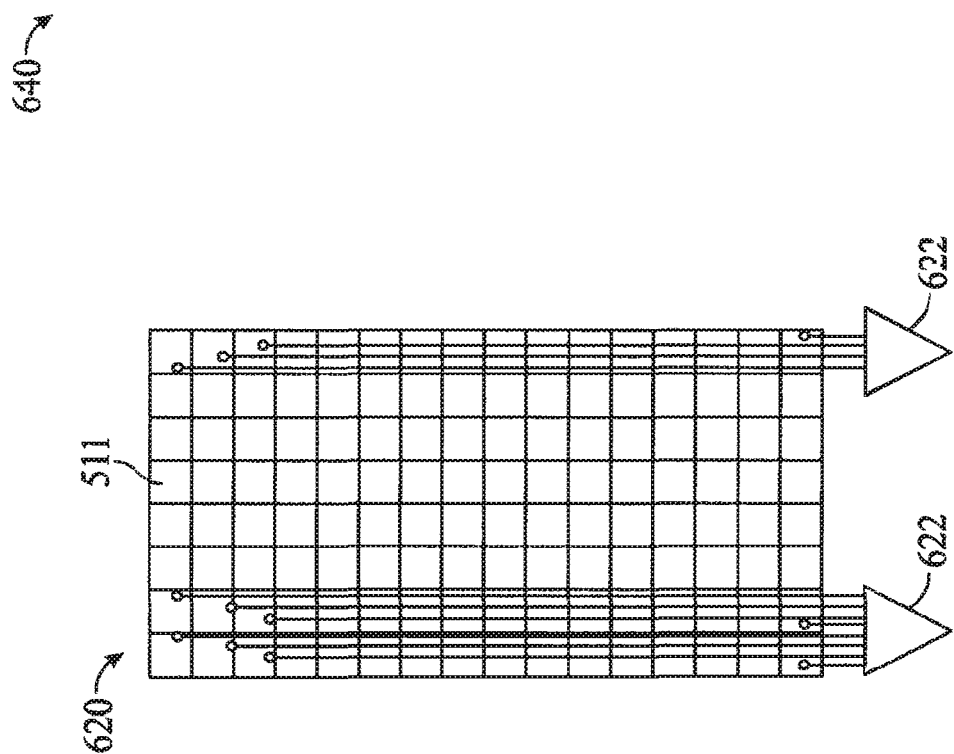

In one example, each circuit element 511 can be connected to a touch controller via a wire that can be routed to a touch controller through "non-active" areas of the touch screen. FIG. 6e illustrates an exemplary routing connection for a single touch pixel electrode according to examples of the disclosure. A circuit element 511 can be connected to a wire 616 through a via structure 614. The via structure 614 can provide a connection point between the circuit element and the wire 616. Referring back to FIG. 6a; the wire, for example wire 602, can be routed back to a touch chip 606 as illustrated. As discussed above, wire 602, which can carry touch signals from circuit element 511 to a touch chip 606/608, can be routed in a different metal layer than the circuit element 511; thus, via structure 614 can provide for an electrical connection between circuit element 511 and wire 602. Touch chips 606 and 610 can include sense circuitry (e.g., sense channels), as described above. In some examples, each circuit element 511 can be assigned its own, dedicated sense circuitry (e.g., its own sense channel) in touch chips 606/610. In some examples, a single sense circuitry (e.g., a single sense channel) in touch chips 606/610 can be shared by two or more circuit elements 511 using, for example, time-multiplexing with one or more multiplexers. In some examples, each circuit element 511 in a column of circuit elements can share a single sense circuitry (e.g., a single sense channel) using, for example, multiplexing with one or more multiplexers.

Another consideration in developing a routing scheme is ensuring that each path between a circuit element and a touch chip has substantially the same resistance. If each path between a circuit element 511 and a touch chip 606 or 610 had varying resistance, the RC time constant of each path may also vary, thus causing a lack of uniformity in bandwidth and ultimately in the signal to noise ratio of each touch pixel electrode. One way to ensure uniformity can be to vary the width of the wire 616 based on the distance the wire has to travel between a circuit element 511 and a touch chip 606 and 610. For example, touch wire 602 has to travel from one side of the TFT layer 600 to the opposite side. In contrast, touch wire 604 only has to connect a circuit element 511 that is proximal to the touch chip 606. In order to account for the varying resistance, touch wire 602 can be patterned to be thicker (i.e., wider) than touch wire 604. In this way, the wide but long wire 602 may have substantially the same resistance as the short but narrow wire 604.

During a display operation of the device, the circuit elements 511 may be driven by a display controller 608. The display controller 608 can route display control signals to display driver circuit 618. Display drive circuit 618 can be disposed on a border region of the device that is not visible to a user. The display drive circuit 618 can then route the signals to a wire matrix 612. The wire matrix 612 can be made from conductive material that may or may not be transparent. The wire matrix 612, as illustrated, can be routed such that it does not cross into an active area of the display. During a touch mode, the device could utilize wire matrix 612 to transmit touch signals; however, the touch signals may see an increased routing resistance since each touch pixel electrode may need to share routing paths with other touch pixel electrodes.

While touch chips 606 and 610 and display controller 608 are illustrated in FIG. 6a as being three separate chips, other configurations are contemplated. For example, touch chips 606 and 610 and display controller 608 can be integrated into a single chip or logic circuit, as illustrated in FIG. 6b (integrated touch and display chip 607). In some examples, the routing from such an integrated touch and display chip to circuit elements 511 can remain substantially as illustrated in FIG. 6a. In some examples, display controller 608 can be split into two or more separate display controller chips, as illustrated in FIG. 6c (split display controller chips 608a and 608b). In such examples, the split display controller chips can be disposed between touch chips 606 and 610, and routing from circuit elements 511 on one side of TFT layer 600 (e.g., the left half of the TFT layer) can be connected to one of the split display controller chips (e.g., the display controller chip 608a disposed on the left), while routing from circuit elements on the other side of the TFT layer (e.g., the right half of the TFT layer) can be connected to the other of the split display controller chips (e.g., the display controller chip 608b disposed on the right) routing from circuit elements 511 to touch chips 606 and 610 can remain substantially as illustrated in FIG. 6a. In some examples, touch chips 606 and 610 and the split display controller chips can be disposed in an alternating manner (e.g., touch chip 606, display controller chip 608a, touch chip 610, display controller chip 608b) in such examples, routing from circuit elements 511 to the touch and display controller chips can be arranged appropriately. In another example in which display controller 608 can be split, touch chips 606 and 610 can be interleaved between split display controller chips, as illustrated in FIG. 6d (split display controller chips 608a, 608b and 608c). For example, display controller 608 can be split into three separate chips. Touch chip 606 can be disposed to the right of a first display controller chip 608a, a second display controller chip 608b can be disposed to the right of touch chip 606, touch chip 610 can be disposed to the right of the second display controller chip 608b, and a third display controller chip 608c can be disposed to the tight of touch chip 610 routing between circuit elements 511 and the various touch and display chips can be arranged appropriately. For example, a left-third of circuit elements 511 can be routed to the first display controller chip 608a, a middle-third of the circuit elements can be routed to the second display controller chip 608b, and a right-third of the circuit elements can be routed to the third display controller chip 608c. Routing from circuit elements 511 to touch chips 606 and 610 can remain substantially as illustrated in FIG. 6a. The above examples are illustrative only, and do not limit the scope of the disclosure. Other configurations of touch and display chips are similarly contemplated, such as configurations in which touch chips 606 and 610 are integrated, or split into more than two chips. Further, those of ordinary skill in the art will understand that touch chips 606 and 610 and display controller 608 can be disposed in arrangements different from those illustrated in FIGS. 6a-6d while still allowing for proper touch screen operation.

FIGS. 6f-6i illustrate additional wire routing schemes for an integrated touch and display layer according to examples of the disclosure. Circuit elements 511 can be routed to touch and/or display chips 622, as shown. Touch and/or display chips 622 can correspond to touch chips 606 and 610 and/or display controller 608 in FIGS. 6a-6d. It is understood that those circuit elements 511 that are illustrated as not being connected to touch and/or display chips 622 can be connected to those chips or other chips in a manner analogous to that displayed for other circuit elements. Further, touch and/or display chips 622 can be the same chip or different chips. Details of the routing of circuit elements 511 to touch and/or display chips 622 can be similar to as described in FIGS. 6a-6e, the details of which will not be repeated here for brevity.

Figure 7:
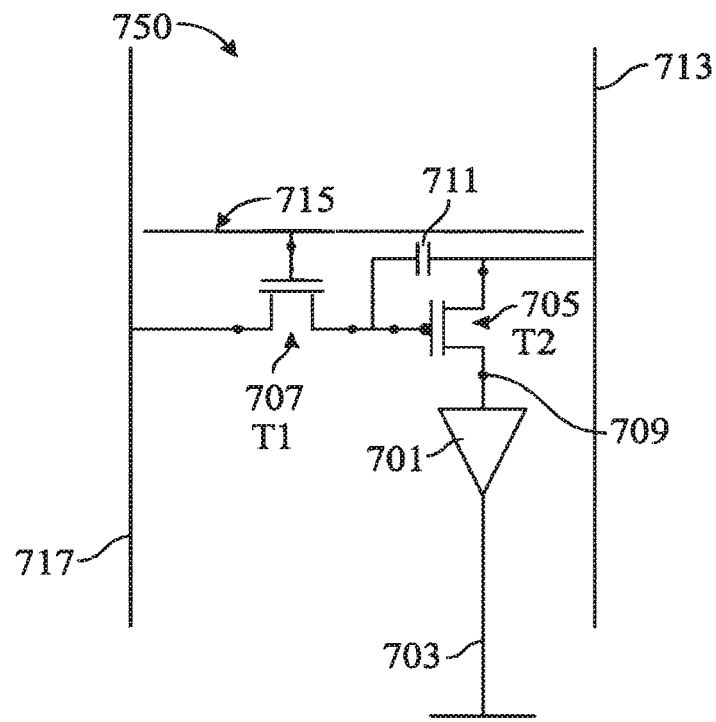
FIG. 7 illustrates an exemplar), OLED display circuit according to examples of the disclosure.

The touch pixel electrode circuit configuration of FIG. 3 is not limited to being integrated with an LCD display, and could also be integrated into various other types of displays such as an organic light emitting diode (OLED) display. FIG. 7 illustrates an exemplary OLED display circuit according to examples of the disclosure. The pixel circuit 750 can include an OLED element 701 having two terminals (a cathode terminal and an anode terminal), a p-type transistor such as TFT T2 705, and an n-type transistor such as TFT T1 707. The cathode terminal of OLED element 701 can be electrically connected to cathode 703. Cathode 703 can be the signal line common to a plurality of pixel circuits in the touch screen, and can correspond to common electrode 401 or 509, for example. The anode terminal of OLED element 701 can be electrically connected to anode 709. OLED element 701 can be connected to cathode 703 and anode 709 in such a way as to allow current to flow through the OLED element when the voltage at the anode is higher than the voltage at the cathode (i.e., OLED element is on, or "forward biased"). OLED element 701 can emit light when it is on. When the voltage at anode 709 is lower than the voltage at cathode 703, substantially no current can flow through OLED element 701 (i.e., OLED element is off, or "reverse biased"). OLED element 701 can emit substantially no light when it is off.

Anode 709 can be electrically connected to the drain terminal of T2 705. The gate and source terminals of T2 705 can be capacitively coupled by way of capacitor $C_{st}$ 711, where one terminal of $C_{st}$ can be electrically connected to the gate terminal of T2 and the other terminal of $C_{st}$ can be electrically connected to the source terminal of T2. The source terminal of T2 705 can further be electrically connected to $V_{DD}$ 713. The gate terminal of T2 705 can further be electrically connected to the drain terminal of T1 707. The gate terminal of T1 can be electrically connected to gate line 715, and the source terminal of T1 can be electrically connected to data line 717.

Figure 8:
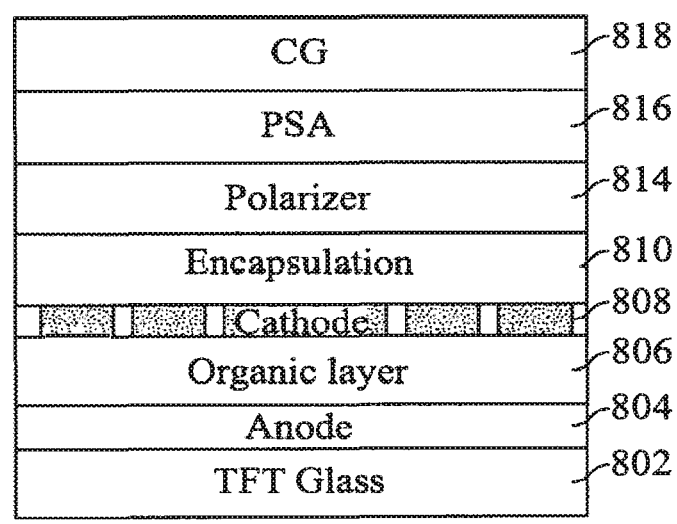
FIG. 8 illustrates an exemplary OLED display stack-up according to examples of the disclosure.

FIG. 8 illustrates an exemplary OLED display stack-up according to examples of the disclosure. As illustrated in FIG. 8, an OLED structure can include an encapsulation layer 810, a cathode layer 808, an organic layer 806 that includes organic light emitting diodes, and an anode layer 804 that can be disposed on top of a TFT glass 802. The stack-up can further include a polarizer 814, a pressure sensitive adhesive layer 816, and a cover glass 818. The cathode layer 808 can contain circuit elements that act as cathodes to an OLED display during a display mode of the device and act as touch pixel electrodes during a touch mode of the device.

Figure 9:
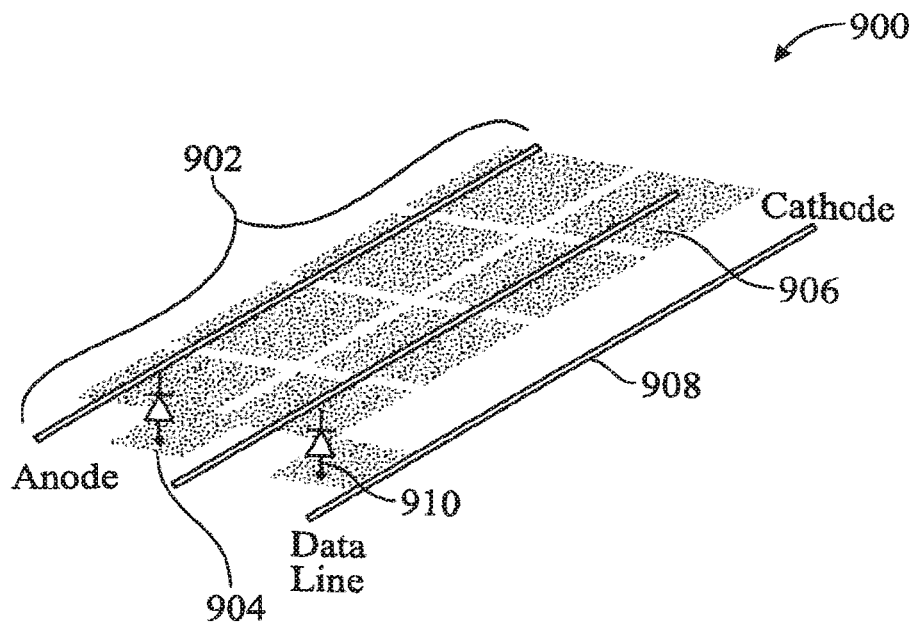
FIG. 9 illustrates a close up view of a portion of the exemplary stack-up of FIG. 8.

FIG. 9 illustrates a close up view of a portion of the exemplary stack-up of FIG. 8. The close up view can include a cathode layer 902, an organic layer that includes organic light emitting diodes 910, and an anode layer that includes anodes 904. As illustrated, the cathode layer 902 can include individual cathode plates 906 that can function as described above in FIG. 7. Each individual cathode 906 can be connected to its own diode 910 and its own anode 904.

As illustrated in FIG. 9, a cathode layer made up of conductive plates can look similar to a TFT layer populated with common voltage electrodes on an LCD display as illustrated in FIG. 4. Thus, similar to an LCD display, an OLED display can have its cathode layer integrated with a self-capacitive sensor similar to the LCD display of FIG. 4.

Figure 10:
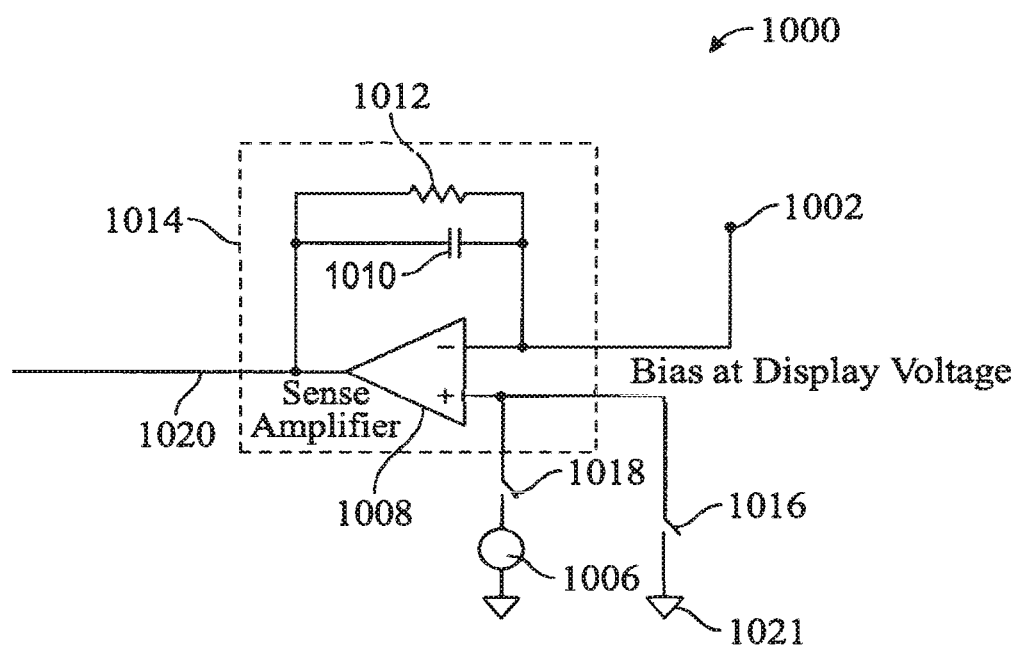
FIG. 10 illustrates an integrated OLED display and self-capacitive touch sensor circuit according to examples of the disclosure.

FIG. 10 illustrates an integrated OLED display and self-capacitive touch sensor circuit according to examples of the disclosure. The circuit of FIG. 10 can be similar to the circuit depicted in FIG. 3. A circuit element 1002 can be connected to a sense circuit 1014. The sense circuit 1014 can be configured to detected changes in a self-capacitance of the circuit element due to an object touching or in close proximity to it. Sensing circuit 1014 can include an operational amplifier 1008, feedback resistor 1012, feedback capacitor 1010 and an input voltage source 1006, although other configurations can be employed. For example, feedback resistor 1012 can be replaced by a switched capacitor resistor in order to minimize any parasitic capacitance effect caused by a variable feedback resistor. The touch electrode 1002 can be coupled to the inverting input of operational amplifier 1008. An AC voltage source 1006 (Vac) can be coupled to the non-inverting input of operational amplifier 1008. The touch sensor circuit 1000 can be configured to sense changes in self-capacitance induced by a finger or object either touching or in proximity to the touch sensor panel. The output 1020 of the touch sense circuit 1000 can be used to determine the presence of a proximity event. The output 1020 can either be used by a processor to determine the presence of a proximity or touch event, or output 1020 can be inputted into a discrete logic network to determine the presence of a touch or proximity event.

The operational amplifier 1008 can also be coupled to a reference voltage 1021 at its non-inverting input. Both the reference voltage 1021 and the AC voltage source 1006 can be coupled to the non-inverting input of the operational amplifier 1008 via switches 1016 and 1018 respectively. During a touch mode of the device, switch 1018 can be closed, while switch 1016 can be opened, thus operating the circuit to detect changes in self-capacitance as discussed above. During a display mode of the device, switch 1016 can be closed, while switch 1016 can be opened, thus biasing the cathode of the OLED structure according to the discussion above. Switches 1016 and 1018 can be time multiplexed in order to time multiplex touch and display functionality as discussed above and as will be further discussed below.

Figure 11:
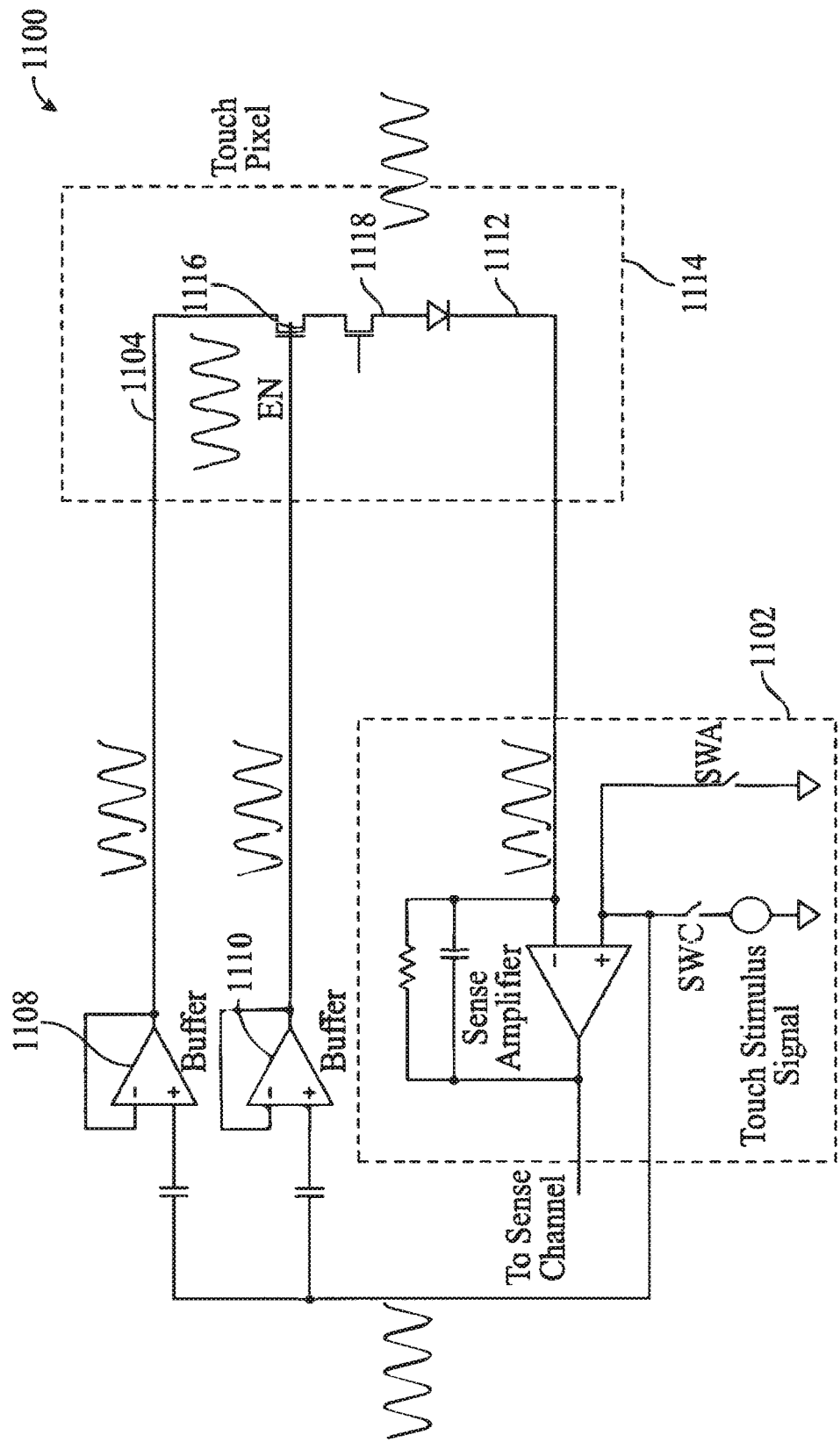
FIG. 11 illustrates an exemplary bootstrapping circuit for an integrated touch sensor and OLED display according to examples of the disclosure.

In an integrated touch and OLED display device, during a touch mode, the light emitting diode may act as a large parasitic capacitance due to the fact that it is not being utilized and is still connected to the touch pixel electrode. The parasitic capacitance caused by the diode may act to limit the bandwidth of the touch detection as well as degrade the signal to noise ratio. "Bootstrapping" the anode and cathode of the diode may work to limit the parasitic capacitance caused by the diode. FIG. 11 illustrates an exemplary bootstrapping circuit for an integrated touch sensor and OLED display according to examples of the disclosure. The circuit 1100 can include an integrated touch and display pixel 1114 coupled with sense circuitry 1102. The details of the integrated touch and display pixel 114 and sense circuitry 1102 have been previously discussed. In order to bootstrap the anode 1118 and cathode 1112 of the diode, the stimulation voltage of sense circuit 1102 can be transmitted to the source and gate of transistor 1116 via voltage buffers 1108 and 1110 respectively. By stimulating the source and gate of transistor 1116 with the same AC voltage, the source and the gate are tied together, causing transistor 1116 to act as a short circuit between the source and the drain. With the source voltage flowing into the drain, the anode 1118 can be biased by the same stimulation voltage as the cathode 1112. Having the anode 1118 and the cathode 1112 stimulated by the same AC voltage can ensure that the DC current across the diode remains constant and thus can work to mitigate any parasitic capacitance effects caused by the diode during a touch sensing mode.

Figure 12:
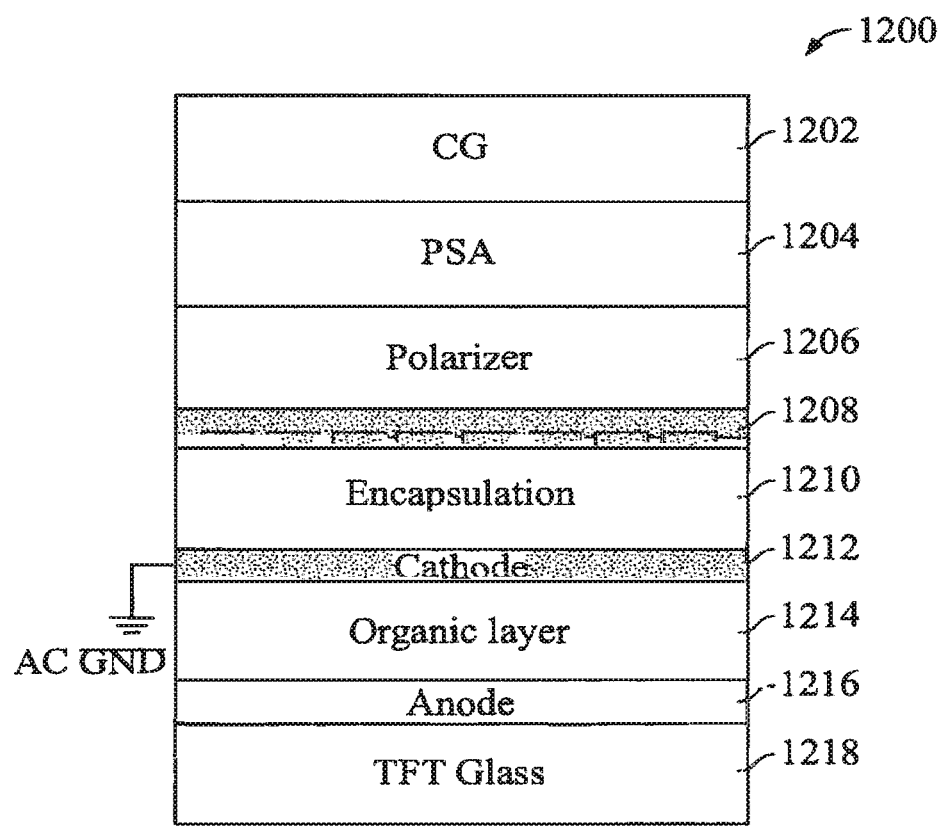
FIG. 12 illustrates an integrated on-cell touch sensor and OLED display according to examples of the disclosure.

The example above illustrates an integrated "in-cell" touch and display (i.e., the display and touch pixel share a common layer), but a touch sensor can also be integrated into an OLED display using an "on-cell" architecture in which the touch sensor occupies its own layer within the display stack-up. FIG. 12 illustrates an integrated on-cell touch sensor and OLED display according to examples of the disclosure. As illustrated in FIG. 12, an OLED structure can include an encapsulation layer 1210, a cathode layer 1212, an organic layer 1214 that includes organic light emitting diodes, and an anode layer 1216 that can be disposed on top of a TFT glass 1218. The stack-up can further include an ITO layer 1208 that is patterned with the touch pixel electrodes similar to the touch pixel electrode and wiring descriptions discussed above, a polarizer 1206, a pressure sensitive adhesive layer 1204, and a cover glass 1202. The cathode layer 1212 can be switchably configured to be coupled to an AC ground during a touch mode so as to minimize parasitic capacitance as will be described below.

Figure 13:
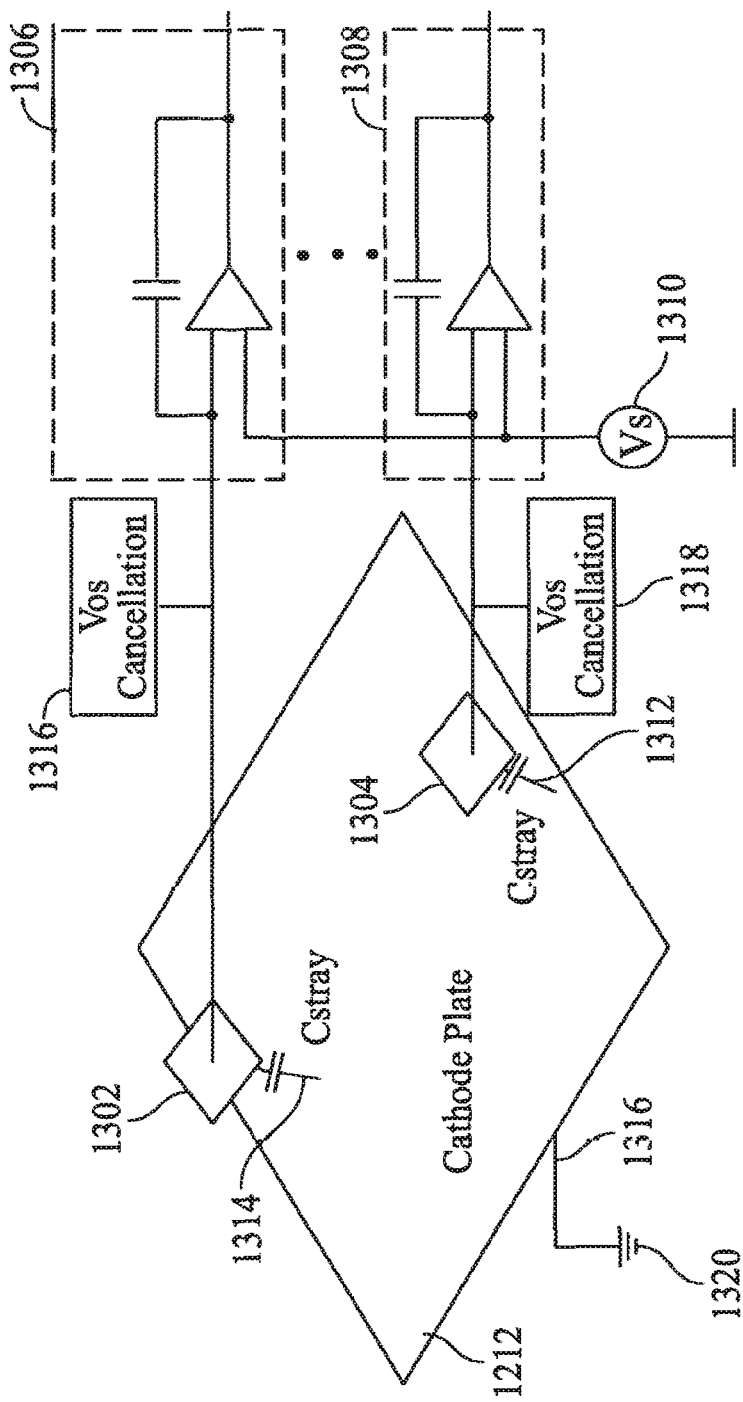
FIG. 13 illustrates an exemplary close up view of the stack-up depicted in FIG. 12.

FIG. 13 illustrates an exemplary close up view of the stack-up depicted in FIG. 12. Touch pixel electrodes 1302 and 1304 can be patterned on ITO layer 1208. Touch pixel electrodes 1302 and 1304 can be coupled to sense circuitry 1306 and 1308 respectively, and the sense circuitry can be coupled to a stimulation source 1310 to operate in a self-capacitance touch sensor configuration as described above. Due to their proximity to the cathode layer 1212, touch pixel electrodes 1302 and 1304 may experience a parasitic capacitance arising from the interaction between the touch pixel electrodes and the cathode layer as depicted by capacitances 1312 and 1314. This parasitic capacitance may cause current to flow from the sense circuitry 1306 and 1308 towards the individual touch pixel electrodes 1302 and 1304. This current flow can waste analog signal dynamic range at the outputs of sense circuitry 1306 and 1308. In order to mitigate the phenomenon described above, cancellation circuits 1316 and 1318 can be coupled to the touch pixel electrodes 1302 and 1304. Cancellation circuits 1316 and 1318 can produce current that can be injected into the touch circuit such that any current flows generated by a parasitic capacitance can be offset such that the effect of the parasitic capacitance is cancelled. The cancellation circuits 1316 and 1318 can be set during an initial calibration, while no touch event is occurring, to ensure that any currents generated by parasitic capacitances are cancelled. Finally, the cathode layer can be AC grounded to further limit the parasitic capacitance seen by the touch circuitry.

Figure 14:
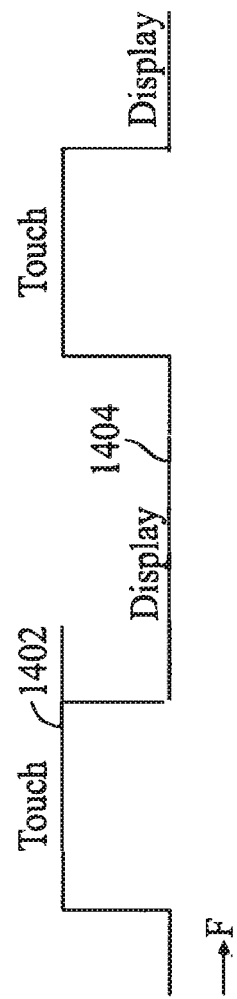
FIG. 14 illustrates an exemplary time line for operating the device in a touch detection mode and a display operation mode.

FIG. 14 illustrates an exemplary time line for operating the device in a touch detection mode and a display operation mode. As illustrated, a touch detection mode 1402 can be alternated with a display operation mode 1404 such that the two modes are mutually exclusive in time. In other words, the two modes 1402 and 1404 can be multiplexed in time. The duration in time of each mode can vary and can depend on other functions of the device. For example, the touch detection mode can occur while the display is in a vertical blanking mode as is known in the art. Further, touch may be detected (e.g., the touch sensor panel may be scanned for touch) one or more times during touch mode 1402. In addition, although examples herein may describe the display circuitry as operating during a display operation, and describe the touch sensing circuitry as operating during a touch sensing operation, it should be understood that a display operation and a touch sensing operation may be operated at the same time, e.g., partially or completely overlap, or the display operation and touch phase may operate at different times.

Also, although examples herein describe certain circuit elements as being multi-function and other circuit elements as being single-function, it should be understood that the circuit elements are not limited to the particular functionality in other examples. In other words, a circuit element that is described in one example herein as a single-function circuit element may be configured as a multi-function circuit element in other examples, and vice versa.

Although examples of this disclosure have been fully described with reference to the accompanying drawings, it is to be noted that various changes and modifications including, but not limited to, combining features of different examples, omitting a feature or features, etc., as will be apparent to those skilled in the art in light of the present description and figures.

For example, one or more of the functions of computing system 200 described above can be performed by firmware stored in memory (e.g. one of the peripherals 204 in FIG. 2) and executed by touch processor 202, or stored in program storage 232 and executed by host processor 228. The firmware can also be stored and/or transported within any non-transitory computer-readable storage medium (not including signals) for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium other than a signal that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Examples may be described herein with reference to a Cartesian coordinate system in which the x-direction and the y-direction can be equated to the horizontal direction and the vertical direction, respectively. However, one skilled in the art will understand that reference to a particular coordinate system is simply for the purpose of clarity, and does not limit the direction of the elements to a particular direction or a particular coordinate system. Furthermore, although specific materials and types of materials may be included in the descriptions of examples, one skilled in the art will understand that other materials that achieve the same function can be used. For example, it should be understood that a "metal layer" as described in the examples below can be a layer of any electrically conductive material.

In some examples, the drive lines and/or sense lines can be formed of other elements including, for example other elements already existing in typical LCD displays (e.g., other electrodes, conductive and/or semiconductive layers, metal lines that would also function as circuit elements in a typical LCD display, for example, carry signals, store voltages, etc.), other elements formed in an LCD stackup that are not typical LCD stackup elements (e.g., other metal lines, plates, whose function would be substantially for the touch sensing system of the touch screen), and elements formed outside of the LCD stackup (e.g., such as external substantially transparent conductive plates, wires, and other elements). For example, part of the touch sensing system can include elements similar to known touch panel overlays.

Although various examples are described with respect to display pixels, one skilled in the art would understand that the term display pixels can be used interchangeably with the term display sub-pixels in examples in which display pixels are divided into sub-pixels. For example, some examples directed to RGB displays can include display pixels divided into red, green, and blue sub-pixels. In other words, in some examples, each sub-pixel can be a red (R), green (G), or blue (B) sub-pixel, with the combination of all three R, G and B sub-pixels forming one color display pixel. One skilled in the art would understand that other types of touch screen could be used. For example, in some examples, a sub-pixel may be based on other colors of light or other wavelengths of electromagnetic radiation (e.g., infrared) or may be based on a monochromatic configuration, in which each structure shown in the figures as a sub-pixel can be a pixel of a single color.

Therefore, according to the above, some examples of the disclosure are directed to a touch sensitive device including a plurality of display pixels, the touch sensitive device comprising: a TFT layer, the TFT layer comprising a plurality of circuit elements that are configurable as a plurality of self-capacitance touch pixel electrodes during a touch detection mode of the device, and are configurable as display circuitry during a display mode of the device, wherein each of the plurality of self-capacitance touch pixel electrodes is electrically isolated from others of the plurality of self-capacitance touch pixel electrodes, and wherein each of the plurality of self-capacitance touch pixel electrodes represents a unique touch location on a touch sensor panel; a plurality of conductive wires, each wire of the plurality of conductive wires configured to transmit a touch signal from one of the plurality of circuit elements to a touch controller of the device; and one or more processing units configured to switch the device between the touch detection mode and the display mode, wherein during the touch detection mode, the plurality of circuit elements are configured as self-capacitance touch pixel electrodes, and during the display mode, the plurality of circuit elements are biased at a common voltage. Additionally or alternatively to one or more of the examples disclosed above, in some examples, the one or more processing units comprise the touch controller. Additionally or alternatively to one or more of the examples disclosed above, in some examples, the touch controller comprises a plurality of sense circuits, and the plurality of conductive wires are configured to transmit the touch signals to the plurality of sense circuits. Additionally or alternatively to one or more of the examples disclosed above, in some examples, the touch detection mode of the device and the display mode of the device are time multiplexed. Additionally or alternatively to one or more of the examples disclosed above, in some examples, a first conductive wire of the plurality of conductive wires has a first width and a first length, and a second conductive wire of the plurality of conductive wires has a second width and a second length, the second length being greater than the first length, the second width being greater than the first width such that a first resistance of the first conductive wire is substantially equal to a second resistance of the second conductive wire, Additionally or alternatively to one or more of the examples disclosed above, in some examples, the device further comprises a wire matrix disposed in a non-active area of a display comprising the plurality of display pixels, the wire matrix configured to transmit display control signals to the plurality of display pixels during the display mode.

Some examples of the disclosure are directed to an organic light emitting diode (OLED) touch sensitive device including a plurality of display pixels, the device comprising: an anode layer; and a cathode layer, the cathode layer comprising a plurality of circuit elements that are configurable as a plurality of self-capacitance touch pixel electrodes during a touch detection mode of the device, and are configurable as a cathode for an OLED display during a display mode of the device, wherein each of the plurality of self-capacitance touch pixel electrodes is electrically isolated from others of the plurality of self-capacitance touch pixel electrodes, and wherein each of the plurality of self-capacitance touch pixel electrodes represents a unique touch location on a touch sensor panel. Additionally or alternatively to one or more of the examples disclosed above, in some examples, the device further comprises: a stimulation circuit, the stimulation circuit configured to stimulate the self-capacitance touch pixel electrodes during the touch detection mode of the device; and a bootstrapping circuit, the bootstrapping circuit configured to stimulate the anode layer of the device with substantially the same signal as being used by the stimulation circuit to stimulate the self-capacitance touch pixel electrodes during the touch detection mode of the device. Additionally or alternatively to one or more of the examples disclosed above, in some examples, the anode layer comprises a plurality of anode elements, and during the display mode of the device, each of the plurality of circuit elements is electrically coupled to a respective anode element of the plurality of anode elements. Additionally or alternatively to one or more of the examples disclosed above, in some examples, each of the plurality of circuit elements is electrically coupled to a respective anode element of the plurality of anode elements via an organic layer comprising a plurality of organic light emitting diodes, Additionally or alternatively to one or more of the examples disclosed above, in some examples, a DC current between the anode layer and the self-capacitance touch pixel electrodes remains substantially constant during the touch detection mode of the device. Additionally or alternatively to one or more of the examples disclosed above, in some examples, the touch detection mode of the device and the display mode of the device are time multiplexed.

Some examples of the disclosure are directed to an organic light emitting diode touch sensitive device including a plurality of display pixels, the device comprising: a cathode layer; an ITO layer, the ITO layer configurable as a plurality of self-capacitive touch sensors during a touch detection mode of the device, and configurable as an anode layer during a display mode of the device, wherein each of the plurality of self-capacitive touch sensors is electrically isolated from others of the plurality of self-capacitive touch sensors, and wherein each of the plurality of self-capacitive touch sensors represents a unique touch location on a touch sensor panel; and an encapsulation layer disposed between the cathode layer and the ITO layer. Additionally or alternatively to one or more of the examples disclosed above, in some examples, the device further comprises: a metal layer, the metal layer connected to the ITO layer through a plurality of vias. Additionally or alternatively to one or more of the examples disclosed above, in some examples, the device further comprises: a cancellation circuit, the cancellation circuit coupled to the ITO layer and configured to cancel a parasitic capacitance effect of one or more of the self-capacitive touch sensors. Additionally or alternatively to one or more of the examples disclosed above, in some examples, the parasitic capacitance effect comprises an offset current, and the cancellation circuit is configured to cancel the parasitic capacitance effect by at least producing an offset cancellation current to offset the offset current. Additionally or alternatively to one or more of the examples disclosed above, in some examples, an operation of the cancellation circuit is determined when no touch event is occurring at the device. Additionally or alternatively to one or more of the examples disclosed above, in some examples, the touch detection mode of the device and the display mode of the device are time multiplexed.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

What is claimed is:

1. An organic light emitting diode touch sensitive display including a plurality of display pixels, the display comprising:
an electrode layer including a plurality of self-capacitance touch sensor electrodes, wherein each of the plurality of self-capacitance touch sensor electrodes is electrically isolated from others of the plurality of self-capacitance touch sensor electrodes;
a cathode layer that is coupled to AC ground during a touch detection mode of the display and is configured to reduce a parasitic capacitance effect on the plurality of self-capacitance touch sensor electrodes, wherein the parasitic capacitance effect includes an effect from capacitive coupling between the plurality of self-capacitance touch sensor electrodes and the cathode layer, and reducing the parasitic capacitance effect includes reducing the capacitive coupling between the plurality of self-capacitance touch sensor electrodes and the cathode layer;

an anode layer;

an organic layer, the organic layer including a plurality of organic light emitting diodes; and an encapsulation layer disposed between the cathode layer and the electrode layer.

2. The display of claim 1, wherein the touch detection mode of the display and a display mode of the display are time multiplexed.

3. The display of claim 1, further comprising:

a metal layer, the metal layer connected to the electrode layer through a plurality of vias.

4. The display of claim 1, further comprising:

a cancellation circuit, the cancellation circuit coupled to the electrode layer and configured to cancel a parasitic capacitance effect of one or more of the self-capacitance touch sensor electrodes.

5. The display of claim 4, wherein:

the parasitic capacitance effect comprises an offset current, and the cancellation circuit is configured to cancel the parasitic capacitance effect by at least producing an offset cancellation current to offset the offset current.

6. A method of operating an organic light emitting diode touch sensitive display including a plurality of display pixels, the method comprising:

providing:

an electrode layer including a plurality of self-capacitance touch sensor electrodes, wherein each of the plurality of self-capacitance touch sensor electrodes is electrically isolated from others of the plurality of self-capacitance touch sensor electrodes;

an anode layer;

an organic layer, the organic layer including a plurality of organic light emitting diodes; and an encapsulation layer disposed between a cathode layer and the electrode layer; and coupling the cathode layer to AC ground during a touch detection mode of the display, wherein the cathode layer is configured to reduce a parasitic capacitance effect on the plurality of self-capacitance touch sensor electrodes, wherein the parasitic capacitance effect includes an effect from capacitive coupling between the plurality of self-capacitance touch sensor electrodes and the cathode layer, and reducing the parasitic capacitance effect includes reducing the capacitive coupling between the plurality of self-capacitance touch sensor electrodes and the cathode layer.

7. The method of claim 6, further comprising time multiplexing the touch detection mode of the display and a display mode of the display.

8. The method of claim 6, further comprising providing a metal layer, the metal layer connected to the electrode layer through a plurality of vias.

9. The method of claim 6, further comprising:

canceling a parasitic capacitance effect of one or more of the self-capacitance touch sensor electrodes using a cancellation circuit coupled to the electrode layer.

10. The method of claim 9, wherein the parasitic capacitance effect comprises an offset current, the method further comprising canceling the parasitic capacitance effect by at least producing an offset cancellation current, using the cancellation circuit, to offset the offset current.

11. An electronic device comprising:

a processor;

memory; and an organic light emitting diode touch sensitive display including a plurality of display pixels, the display comprising:

an electrode layer including a plurality of self-capacitance touch sensor electrodes, wherein each of the plurality of self-capacitance touch sensor electrodes is electrically isolated from others of the plurality of self-capacitance touch sensor electrodes;

a cathode layer that is coupled to AC ground during a touch detection mode of the display and is configured to reduce a parasitic capacitance effect on the plurality of self-capacitance touch sensor electrodes, wherein the parasitic capacitance effect includes an effect from capacitive coupling between the plurality of self-capacitance touch sensor electrodes and the cathode layer, and reducing the parasitic capacitance effect includes reducing the capacitive coupling between the plurality of self-capacitance touch sensor electrodes and the cathode layer;

an anode layer;

an organic layer, the organic layer including a plurality of organic light emitting diodes; and an encapsulation layer disposed between the cathode layer and the electrode layer.

12. The device of claim 11, wherein the touch detection mode of the display and a display mode of the display are time multiplexed.

13. The device of claim 11, further comprising:

a metal layer, the metal layer connected to the electrode layer through a plurality of vias.

14. The device of claim 11, further comprising:

a cancellation circuit, the cancellation circuit coupled to the electrode layer and configured to cancel a parasitic capacitance effect of one or more of the self-capacitance touch sensor electrodes.

15. The device of claim 14, wherein:

the parasitic capacitance effect comprises an offset current, and the cancellation circuit is configured to cancel the parasitic capacitance effect by at least producing an offset cancellation current to offset the offset current.

* * * * *